(12) United States Patent
Boroson et al.

(10) Patent No.: US 10,707,452 B2
(45) Date of Patent: Jul. 7, 2020

(54) METHOD FOR MAKING OLED WITH PASS-THROUGH HOLE

(71) Applicant: OLEDWorks LLC, Rochester, NY (US)

(72) Inventors: Michael Boroson, Pittsford, NY (US); Stephen P. Singer, Spencerport, NY (US)

(*) Notice: Subject to any disclaimer, the term of this patent is extended or adjusted under 35 U.S.C. 154(b) by 50 days.

(21) Appl. No.: 16/144,139

(22) Filed: Sep. 27, 2018

(65) Prior Publication Data

US 2020/0106054 A1  Apr. 2, 2020

(51) Int. Cl.
| | | |
|---|---|---|
| H01L 21/00 | (2006.01) | |
| H01L 51/56 | (2006.01) | |
| H01L 27/32 | (2006.01) | |
| H01L 51/52 | (2006.01) | |

(52) U.S. Cl.
CPC ............. H01L 51/56 (2013.01); H01L 27/32 (2013.01); H01L 51/5246 (2013.01)

(58) Field of Classification Search
CPC ...... H01L 51/56; H01L 51/5246; H01L 27/32
See application file for complete search history.

(56) References Cited

U.S. PATENT DOCUMENTS

| | | | |
|---|---|---|---|
| 6,998,648 B2 | 2/2006 | Silvernail | |
| 8,053,977 B2 | 11/2011 | Lifka et al. | |
| 8,253,329 B2 | 8/2012 | Kostka et al. | |
| 9,219,245 B2 | 12/2015 | Jung et al. | |
| 9,343,695 B2 | 5/2016 | Hack et al. | |
| 9,761,837 B2 | 9/2017 | Zhang et al. | |
| 9,818,977 B2 | 11/2017 | Hack et al. | |
| 9,831,467 B2 | 11/2017 | Meyer et al. | |
| 2005/0255285 A1 | 11/2005 | Uchibori et al. | |
| 2006/0223903 A1 | 10/2006 | Cao et al. | |
| 2015/0014636 A1* | 1/2015 | Kang | H01L 51/525 257/40 |
| 2016/0181347 A1* | 6/2016 | Lou | H01L 51/52 257/40 |
| 2017/0108971 A1* | 4/2017 | Yang | G06F 1/163 |

FOREIGN PATENT DOCUMENTS

| | | |
|---|---|---|
| CN | 104576709 A | 4/2015 |
| CN | 107863453 A | 3/2018 |
| EP | 0577276 A2 | 1/1994 |
| EP | 1270675 A1 | 1/2003 |
| KR | 100635576 B1 | 10/2006 |
| WO | 2017218500 A1 | 12/2017 |
| WO | 2018032863 A1 | 2/2018 |

* cited by examiner

Primary Examiner — Richard A Booth

(57) ABSTRACT

A method of making an encapsulated OLED panel with a pass-through hole comprising: creating a pass-through hole with side walls within the central emission area of an OLED panel; providing at least a first support element arranged in contact with a portion of a face of the OLED panel and overlapping the edge of the hole such that a portion of the support element is located above or within the hole and is spaced from the side walls; and providing a sealant in contact with the first support element and desirably, the side walls as well. Both the first support element and sealant provide a barrier to moisture and oxygen from entering the internal OLED structures through the cut side wall formed during the creation of the pass-through hole in a previously encapsulated OLED panel.

18 Claims, 17 Drawing Sheets

METHOD FOR MAKING OLED WITH PASS-THROUGH HOLE

BACKGROUND

OLED panels, which rely on OLED technology to generate light, offer many advantages for general lighting and display purposes. They are efficient in terms of light output for power consumed. They are low voltage which helps avoid potential electrical shocks, less prone to sparking in potentially explosive environments, and they reduce loads in the supporting electrical system. The spectrum of emitted light can be varied using appropriate internal designs. They produce little or no UV or IR light. They are instant on; that is, they emit light immediately whenever electrical power is supplied. OLED light sources are inherently flat area light sources. They offer several advantages over LED panels. They can be made even thinner (for example, less than 1 mm thick) and they produce less heat under normal operating conditions. However, OLED lifetimes can be an issue. Both LED and OLED panels can be made on flexible or curved substrates even though OLED is preferred for these types of applications. In summary, OLED panels can be useful for lighting and display applications. They are efficient, low voltage, cool to the touch, and are thin. Luminaires (a complete unit with a light source (i.e. a lamp) and a supporting part (i.e. a lamp-holder) that provides light and illumination) can be designed to utilize OLED panels as the light sources. Displays using OLED panels can either be direct, for example, the OLED panel contains individually controlled Red, Green and Blue (RGB) subpixels; Red, Green, Blue and White (RGBW) subpixels; individually controlled White subpixels with a color filter array or individually controlled Blue subpixels with a color conversion array; or indirect, for example, the OLED panel is used as a White backlight for an LCD panel used for RGB display.

In the lighting industry, luminaire design is often of critical importance. Besides addressing general or specific illumination needs, luminaires become part of the architectural environment. It would be very desirable to design luminaires that take advantage of some of the unique physical characteristics of OLEDs that differ from other light sources such as LED. The same considerations can also be applied to display applications.

Generally speaking, an OLED panel for use in a luminaire or a display would have at least three parts: an OLED substrate or support, an OLED light-emitting unit, and electrical connections which provide power to the internal OLED electrodes from an external source. An OLED light-emitting unit would have at least one organic electroluminescent layer between two electrodes on a substrate and would be encapsulated to protect the electroluminescent layer(s) from air and/or water. Typically, the OLED panel would have a central emissive area (continuous for lighting applications or subpixels for direct display applications) surrounded by non-emitting borders. Electrode contact pads, which are connected to the internal electrodes, are often located in these non-emitting border areas on the same face of the substrate as the electroluminescent layers.

For some luminaire designs, it would be desirable to use an OLED panel as a light source where the OLED panel has a pass-through hole. In such cases, the OLED lighting panel would have at least one hole or opening that is large enough to allow objects behind the panel to be viewed through the hole. Alternatively, the pass-through hole is large enough so that a solid element can pass through the hole. In both cases, the pass-through hole does not affect light emission in the surrounding area of the panel. The pass-through hole would be entirely within the central emission area of the OLED panel and is surrounded on all sides by a continuous and uninterrupted emitting area of the OLED panel. The space within the border of the pass-through hole is entirely empty; that is, there is no part of the OLED panel that exists within the hole. It is not merely a transparent and non-emitting area within the central emission area of the OLED panel. A pass-through hole could also be referred to as a through-hole, thru-hole or clearance hole, all of which are equivalent terms.

The OLED panel with a pass-through hole could also be a pixelated image display. In this case, the pass-through hole would be within the central display area of the OLED and is surrounded on all sides by a continuous and uninterrupted display area of the OLED panel. In such cases, the OLED display panel would have at least one hole or opening that is large enough to allow objects behind the panel to be viewed through the hole. Alternatively, the pass-through hole is large enough so that a solid element can pass through the hole.

In some designs, the pass-through hole is large enough that objects behind the panel are clearly visible. It is often not necessary that an entire object must be viewed, but only that it is sufficiently viewed to be detectable. However, the exact size of the pass-through hole needed to allow visibility of objects depends on many factors.

Firstly, since the light from the object (whose intensity is inversely proportional to the distance from the object) must pass through the hole, it is clear that the hole must be large enough to allow a sufficient amount of light from the object to pass to be viewable. This situation is complicated by the surface of the OLED panel which also emits light towards the viewer, thus partially diluting the light coming from the object.

Secondly, there is a problem related to the parallax effect when viewing through a hole. For example, consider the schematic diagram in FIG. 1A where P is the viewer, O is the optical axis of viewing, s is the distance between the hole and the viewer, f is the distance between the hole and the object, d is the total distance between the viewer and object, H is the size of the hole opening and $q_d$ represents the viewable size of the object that lies in plane S.

FIG. 1B illustrates the problem of viewing objects through a hole opening H which is very small, such as a pinhole. Assuming that the viewer P is as least the same distance in front of the hole as the distance of an object from the back of the hole, solid sightlines a, coming from the edge of an object, will not be in the field of view to the viewer P. Dotted sightlines b, also coming from the edge of the object but would be in the view of field to the viewer P, are blocked. Dashed sightlines c, coming from the viewer P through the hole opening H, will only subtend a limited part $q_d$ of the object. In this case, this subtended viewing area may not be enough to visibly detect the object through opening H.

FIG. 1C illustrates a similar situation where the hole opening H is large; in this example, at least as big as the object to be viewed through the hole. Assuming again that the viewer P is as least the same distance in front of the hole as the distance of an object from the back of the hole, solid sightlines a, coming from the edge of an object, will no longer exhibit any parallax issues. Dotted sightlines b, also coming from the edge of the object will be in the field of view to the viewer P. Sightlines c, coming from the viewer P through the hole opening H, will subtend over an area greater than the object. In this case, the object should be viewable through opening H. Typically, for OLED panels used as lighting, the distance s between the viewer and panel would generally in the range of multiple meters and the distance f between the object and the back of the panel would be typically be the same or less than the distance s and often significantly less. In such situations, it is easy to see that the size H of the pass-through hole would need to be relatively large in order to have a significant viewing size of the object. Even in the case where the OLED panel is a display and the position of the viewer is much closer (typically 0.1-0.5 meter) to the hole, the size of the hole would still need to be much larger than the pixels in order for an object to be visible. The depth or thickness of the hole can impact the hole size needed for visibility of objects; however, OLED panels and housings are generally thin enough not be a significant consideration in this regard.

In some designs, there can be a solid element that extends through the pass-through hole or at least partially within the pass-through hole. In such cases, the OLED panel with the pass-through and the solid element together form a single integral unit. In some designs, the presence of the solid element is strictly decorative and the OLED panel/solid element unit provides architectural interest. In other designs, the solid element provides a function such as mechanical support or space to conceal electrical wires.

U.S. Pat. No. 8,053,977 describes OLEDs for phototherapy with pass-through perforations that allow fluids and/or heat to escape when onto human skin. The holes appear to be small (a diameter of 40 µm is given as an example) relative to the overall size of the OLED. This reference also describes a method where the deposition of electrode/organic/electrode layers is prevented (presumably via masking) near the perforation area, followed by encapsulation over everything, followed by perforation.

CN104576709 describes a wearable OLED display (i.e. wristwatch) where the pixels have ventilation holes in order to make it breathable. The holes are small (80 microns). This reference describes the formation of an OLED (anode/ organic/cathodes/SiN protective layer) uniformly over a flexible base, forms the holes, then encapsulates. The holes are cone shaped with sloping sides (small at the front of the substrate then larger towards the back).

In both of the above references, the holes in the OLED are very small and are sized to allow for air and fluid exchange when the OLED is placed next to the skin. The holes as described would not large enough to view the skin through the OLED. In both of these references, the internal structure of the OLED is modified prior to encapsulation to allow the formation of the pinhole without breaking a pre-existing encapsulation.

It is the object of the invention to provide a method for the re-encapsulation of the cut edges of a pass-through hole when the pass-through hole is formed in an OLED that was already fully encapsulated. When a pass-through hole is formed in the emissive area of an OLED, the edges of the moisture- and oxygen-sensitive OLED layers will be exposed to the atmosphere along the side walls of the pass-through hole. It is well known that moisture and oxygen can travel laterally through thin organic layers if the edge of the layer is left exposed. For cost and availability considerations, it would be advantageous to begin with an existing fully encapsulated OLED and then form the pass-through hole. However, it is necessary to re-establish the encapsulation along the newly formed cut edges along the side walls of the pass-through hole of the OLED panel in order to maintain its useful lifetime. An OLED panel with a pass-through hole that allows visibility through the opening is useful because it enables unique designs of luminaires or displays.

U.S. Pat. Nos. 9,343,695 and 9,818,977 describes OLEDs with light-emitting areas that can be made in any desired shape by cutting or etching the substrate and OLED layers in at least two steps. The formation of pass-through holes is not disclosed. Side edge encapsulation of vertical cuts made after encapsulation is discussed. For example, these references disclose that sealing polymers, with or without moisture-absorbent materials, or metal may be applied to the cut edges to reestablish the encapsulation. However, it has proven difficult and unreliable to apply a sufficient amount of sealing material directly to a thin cut edge to provide sufficient protection against moisture and oxygen.

U.S. Pat. No. 9,219,245 describes where an OLED on top of a substrate is encapsulated by covering the OLED with a sealing substrate, larger than the OLED substrate, with an adhesive and folding the edges of the sealing substrate over the edges of the OLED substrate. There may be a filler or moisture-absorbing materials or both in the space between the side and back edges of the OLED substrate where it meets the sealing substrate. The disclosed method relates only to the straight outside edges of the substrate which are already encapsulated.

U.S. Pat. No. 8,253,329 describes a method of encapsulating OLEDs where the edges of an impermeable backsheet (substrate) extend past the edges of emitting portion of the OLED and are folded over the edges of the light-emitting portions to come into contact with a top barrier sheet over the emitting portions, thus forming the sides of the encapsulation package. There may be an adhesive between the edge of the emitting portions and the top of the barrier sheet and the folded backsheet. The adhesive may contain moisture absorbing materials. This method is not applicable for re-encapsulation of a newly formed pass-through hole.

U.S. Pat. No. 9,831,467 describes the encapsulation of multiple OLED units on a single flexible substrate by applying thin-film encapsulation of a first inorganic layer, intermediate organic layer and second inorganic layer uniformly across the substrate, removing the thin-film encapsulation from the substrate along the edges and/or around where the substrate is to be cut and reapplying thin-film encapsulation to the areas where it has been removed. The second thin-film encapsulation prevents the organic layer of the first thin-film encapsulation in each separated OLED device from being exposed after cutting. However, this requires removal of materials in certain areas which adds manufacturing costs and creates the possibility of contamination during the removal process. In addition, the OLED panel becomes thicker since there will be two encapsulation layers over the bulk of the device.

KR10-0635576 describes a method of further protecting the side edges of existing encapsulation by applying a protective film over the seam where a top encapsulation meets the substrate.

U.S. Pat. No. 9,761,837 describes the formation of multiple OLED units on a substrate, then forming a common thin-film encapsulation of a first inorganic layer, intermediate organic layer and second inorganic layer, followed by a common protective layer. The substrate is then cut between the OLED units in an area where the second inorganic layer is in contact with the substrate to form individual encapsulated OLED devices.

CN107863453A describes the encapsulation of an OLED using a metal foil along the side edge which is ultrasonically welded to a metal foil over the non-emitting face of the OLED.

U.S. Pat. No. 6,998,648 describes encapsulated OLEDs where a cover with a getter region is bonded to a substrate using a pressure sensitive UV curable adhesive.

EP0577276A2, EP1270675A1, US20050255285, US20060223903 and WO2017/218500 all describe suitable getter or desiccant materials and formulations for use in encapsulation.

SUMMARY

Disclosed is a method of making a fully encapsulated OLED panel with a pass-through hole comprising: creating a pass-through hole having side walls such that the pass-through hole is located entirely within the central emission area of an OLED panel; providing at least a first support element arranged in contact with at least a portion of the top or bottom face of the OLED panel and overlapping the edge of the pass-through hole such that at least a portion of the support element is located above or within the pass-through hole and spaced from the side walls of the pass-through hole; and providing a sealant in contact with the first support element and located along the side walls of the pass-through hole. Desirably, the sealant is in direct contact with the side walls. Both the first support element and sealant provide a barrier to moisture and oxygen from entering the internal OLED structures through the cut side wall formed during the creation of the pass-through hole in a previously encapsulated OLED panel.

The support element can be in contact with at least a portion of one or both top and bottom faces of the OLED panel. While it is not strictly necessary that the support element acts as barrier, it is desirable that it provides a sufficient barrier to oxygen and water to re-establish the encapsulation broken by the creation of the pass-through hole. Desirably, it is metal or a laminated barrier film.

The sealant can be any material that provides a sufficient barrier to oxygen and water to re-establish the encapsulation broken by the creation of the pass-through hole. It may have adhesive properties. The sealant can comprise moisture absorbing getter particles. Desirably, the sealant is at least 3 mm thick along the side wall.

The first support element can be a bushing with a lip having the same shape as the pass-through hole and sized as to fit within the pass-through hole. The sealant is located between the walls of the bushing and the side walls of the pass-through hole. There can be a barrier film in contact with the wall of the busing and the other face of the OLED panel opposite from the lip of the bushing so that it covers the sealant.

There can be a second support element being in contact with at least a portion of the face of the OLED panel opposite the first support element such that the sealant is in contact with both the first and second support elements and desirably, the side walls of the pass-through hole as well. Both the first and second support elements can span the entire area of the pass-through hole. Both the first and second support elements can be transparent moisture barrier films. In such cases, there can be an additional step of providing a second pass-through hole through the first and second support elements; said second pass-through hole being smaller in area than the pass-through hole in the OLED panel such that at least a portion of the sealant remains located along the side walls of the pass-through hole in the OLED panel. The sealant can optionally fill the entire area of the pass-through hole of the OLED panel prior to forming the second pass-through hole.

The OLED panel is desirably a lighting panel. If the OLED panel has an emission surface of 10,000 mm$^2$ or less, the pass-through hole has a minimum opening area of at least 1.7 mm$^2$. If the OLED panel has an emission area of greater than 10,000 mm$^2$, the pass-through hole has a minimum opening area of at least 0.017% of the total emission surface.

Because some of the structures involved are very small, the Figures are illustrative only and are not drawn to scale.

DETAILED DESCRIPTION

In the following, the example OLED panels are all shown as being rectangular in shape. However, the OLED panels are not limited to any particular shape and so, may be square, circular, oval, triangular or an irregular shape. Rectangular, square or circular panels are preferred. In addition, although the examples refer to using an OLED as a specific example of a light-emitting unit, any kind of light-emitting unit containing organic material would be generally useful. The OLED panels are flat and thin. By "flat", it is meant that the thickness dimension is much less (generally less than 1:100) than the length and/or width dimensions. Note that "flat" refers only to the ratio of thickness to the other two dimensions; thus a "flat" OLED can have a bent or curved shape. Moreover, an OLED panel will have top and bottom "faces" along the length and width dimensions. At least one of these faces will be light emissive. An "edge" of the OLED panel is along the thickness dimension. A "pass-through" hole has an unobstructed opening that is large enough so that an appropriately sized solid object or element can freely pass through the opening from one side of the hole to the opposite side.

Figure 2A:
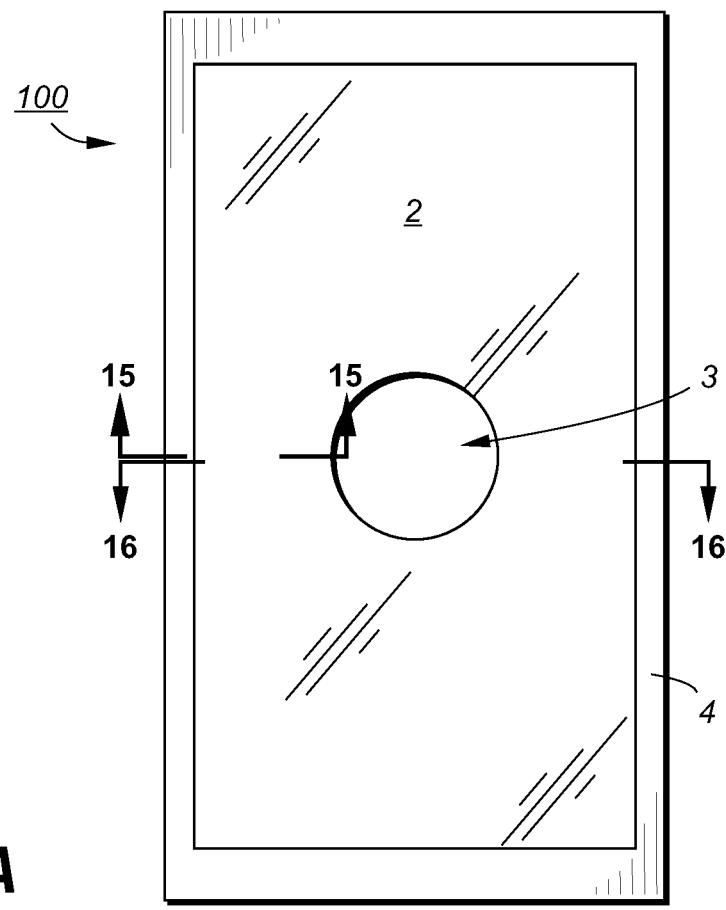
FIGS. 2A and 2B are overhead and side views of an OLED panel with a pass-through hole.
Figure 2B:
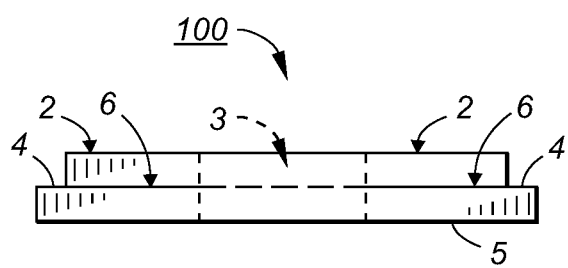

FIG. 2A is an overhead view of an OLED panel 100 with a pass-through hole. The center emissive area of the OLED panel is 2 and the non-emitting border is 4. The pass-through hole is 3. FIG. 2B is a cross-sectional view of OLED panel 100 where 2, 3 and 4 are the same and 5 is the OLED panel substrate and 6 is the OLED light-emitting unit. In both FIGS. 2A and 2B, the pass-through hole 3 runs completely through the entire OLED panel 100 including the OLED panel substrate 5 and the OLED light-emitting unit 6 and is located entirely within the emissive area 2 of the OLED panel 100. Note that the cut ends of 5 and 6 together form the side wall of the pass-through hole 3 in FIG. 2B.

Although the pass-through hole shown in FIGS. 2A and 2B is circular, the pass-through hole may be any desired shape. For example, it could be oval, square, rectangular, a regular polygon (such as a star or an octagon) or an irregular shape. A circle or square is preferred. The walls or sides of the pass-through hole are desirably vertical (that is, perpendicular to the front and back surfaces of the OLED panel) but may be slanted either front-to-back or back-to-front if desired. The side walls need not be straight, but can be curved or stepped if desired.

The size or area of the opening of the pass-through hole is important in order to enable viewing of objects through the pass-through hole or to allow solid elements to fit within the pass-through hole. Small holes such as pinholes (generally considered to be less than 1 mm in diameter or about 0.8 mm$^2$ in area) do not have a large enough opening to allow a sufficient amount of light to pass through in order to make an object visible (without aid) through the OLED panel nor a large enough viewing angle of the object at typical viewing and object distances. It would also very difficult to fit a solid element within a pinhole since the solid element would have to be very thin and so, would not be rugged and would be vulnerable to breakage, would not have any internal space for providing any additional function and would be difficult to introduce into the pass-through hole.

The useful area of the pass-through hole will somewhat depend on the size of the OLED panel because the viewing distance will typically vary according to the overall size of the OLED panel. In general, the viewing distance will be shorter for smaller OLED panels and will be longer for larger OLED panels. For this reason, the pass-through hole for small OLED panels, defined as having an emission surface of 10,000 mm$^2$ (100 cm$^2$) or less, should have a minimum opening area of at least 1.7 mm$^2$ (roughly equivalent to a circle of 1.5 mm diameter), more desirably at least 7 mm$^2$ (roughly equivalent to a circle of 3 mm diameter), even more desirably at least 20 mm$^2$ (roughly equivalent to a circle of 5 mm diameter) and most desirably at least 80 mm$^2$ (roughly equivalent to a circle of 10 mm diameter).

For larger OLED panels, defined as those with an emission area of greater than 10,000 mm$^2$ (100 cm$^2$), the pass-through hole should have a minimum opening area of at least 0.017% of the total emission surface (including the pass-through hole). This would roughly correspond to a circular pass-through hole of diameter 0.15 cm or 1.5 mm (area=0.017 cm$^2$) for a rectangular OLED panel with an emission surface of 100 cm$^2$ (5 cm×20 cm). More desirably, the pass-through hole should have an opening area of at least 0.07% of the total emission surface. This would roughly correspond to a circular pass-through hole of diameter 0.3 cm or 3 mm (area=0.07 cm$^2$) for the same 5 cm×20 cm OLED panel. Even more desirably, the pass-through hole should have an opening area of at least 0.2% of the total emission surface. This would roughly correspond to a pass-through hole of diameter 0.5 cm (area=0.2 cm$^2$) for a 5 cm×20 cm OLED panel. Most desirable, the pass-through hole should have an opening area of at least 0.8% of the total emission surface. This would roughly correspond to a circular pass-through hole of diameter 1.0 cm (area=0.8 cm$^2$) for a 5 cm×20 cm OLED panel.

In the context of this invention, the area of the pass-through hole refers to the area of the unobstructed part of the pass-through hole that is created when an opening is formed in an OLED panel. Because of the need to re-encapsulate the cut edges of the pass-through hole that is created in an existing fully encapsulated OLED, the area of the opening created in the OLED will typically be larger than the area of the pass-through hole. This is because the sealant and support element (if present) applied along the cut edges will decrease the unobstructed portion of the opening. The terms "cut edges" and "side walls" refer to the newly created surfaces in the thickness direction (perpendicular to the flat planes and emissive direction of the OLED panel) when an opening is formed in the OLED panel and may be used interchangeably.

Although FIGS. 2A and 2B illustrate an example of an OLED panel with just one pass-through hole, an OLED panel may contain more than one pass-through hole if desired. The pass-through holes may be arranged in a pattern or may be located randomly across the emission surface. The pass-through holes may all be the same size or different sizes. The pass-through holes may be all the same shape or may be a mixture of different shapes.

Figure 3A:
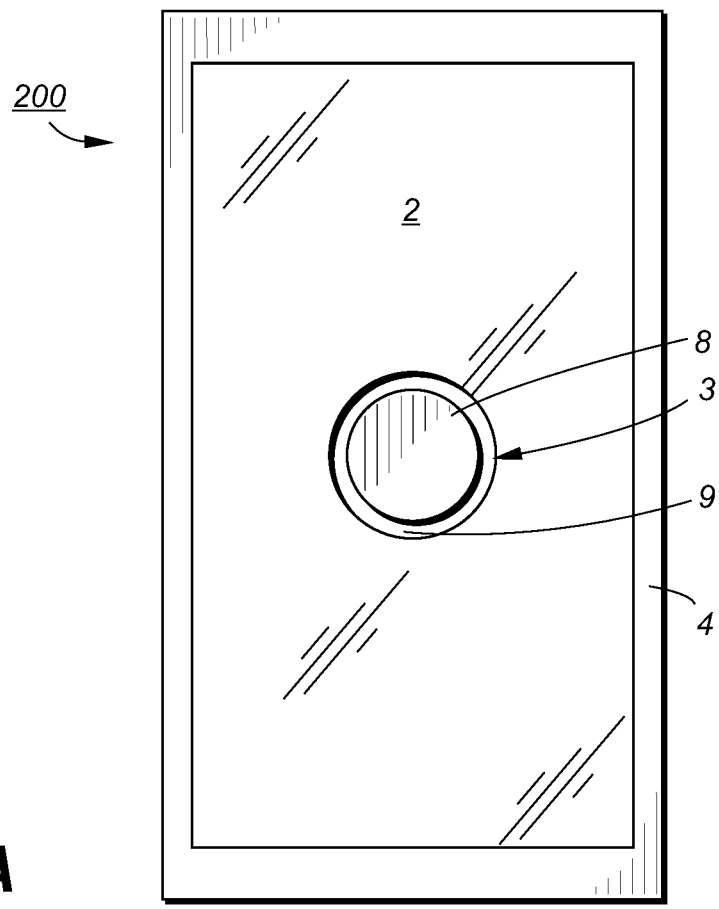
FIGS. 3A and 3B are overhead and side views of an OLED panel with a pass-through hole with a solid element that extends through the pass-through hole.
Figure 3B:
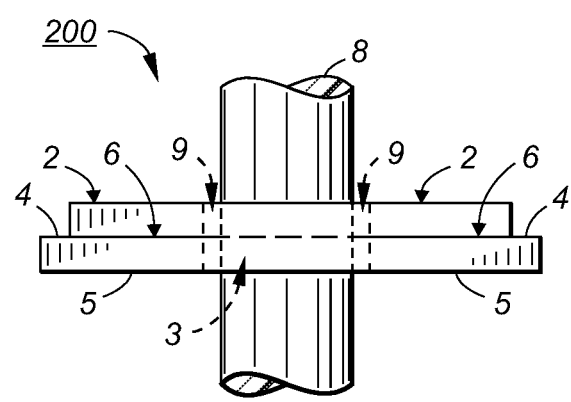

FIG. 3A is an overhead view of an OLED panel 200 with a pass-through hole 3 with a solid element 8 that is located within the pass-though hole 3. In FIG. 3A, it can be seen that solid element 8 has a circular cross-section. In this example, the diameter of the solid element 8 is smaller than the diameter of the pass-through hole 3, leaving gap 9. FIG. 3B is a side view of OLED panel 200 showing that solid element 8 passes completely through the pass-through hole 3. Together, the OLED panel 200 with a pass-through hole 3 through which solid element 8 fits is a cohesive single unit that can be an integral part of a luminaire or display.

In the example shown in FIGS. 3A and 3B, the pass-through hole 3 is circular as is the diameter of the solid element 8. However, the solid element 8 can have any cross-sectional shape. For example, it could have a cross-section that is oval, square, rectangular, a regular polygon (such as a star or an octagon) or an irregular shape. A circle is preferred. The cross-sectional shape of the solid element 8 does not have to correspond to the shape of the pass-through hole 3. For example, the solid element 8 could be square in cross-section whereas the pass-through hole 3 is circular. However, it is preferred that the cross-sectional shapes of the solid element 8 and the pass-through hole 3 are the same.

In the example shown in FIGS. 3A and 3B, the diameter of the circular cross-section of solid element 8 is less that the diameter of pass-through hole 3, thus leaving a gap 9 between them. However, in some designs, there is no gap between the outer walls of the solid element 8 and the vertical walls of the pass-through hole 3 and they are in direct contact. The gap 9, if present, can be sized as desired nor does the gap 9 have to be uniform even if the solid element 8 and the pass-through hole 3 have the same cross-section; that is, the solid element 8 can be located within the hole so the gap 9 is larger in some areas and less in others. If the inner edges of the pass-through hole 3 are not vertical, the outer walls of the solid element 8 may be designed to match the contours of the inner walls of the pass-through hole 3 to make full contact.

In the example shown in FIGS. 3A and 3B, the solid element 8 is shown as being completely filled and uniform across its cross-section. However, this is not necessary. Solid element 8 is only solid in the sense that it is firm and stable in shape as opposed to being liquid or fluid, and not in the sense of solid meaning not hollow or not containing spaces or gaps. The solid element 8 may be hollow or tube-like or may be filled with many open spaces or cells such as being foam-filled. It may contain wires for electrical connections to the OLED panel or display. It may contain or be outfitted with sensors for detecting temperature, light, motion, touch and the like. It may also contain the control circuitry for the OLED panel or display as well as control switches such as on/off. The solid element 8 may be rigid or flexible and may have hinges or joints that allow movement or changes in position. The solid element 8 may be opaque or transparent. Moreover, the solid element 8 can be uniform across its entire length or may vary independently in both cross-section and size as desired. The solid element 8 may be made from any suitable materials including rigid materials (solid or hollow as desired) such as metal, glass, plastic, wood, etc. or flexible materials (solid or hollow as desired) such as metal wire or cable, flexible plastic, rope or string, etc.

In the example shown in FIGS. 3A and 3B, the solid element 8 is shown as being situated perpendicular to the plane of the OLED panel. However, this is not necessary and the solid element 8 may extend through the pass-through hole 3 at any angle to the plane of the OLED panel that is desired.

Figure 4A:
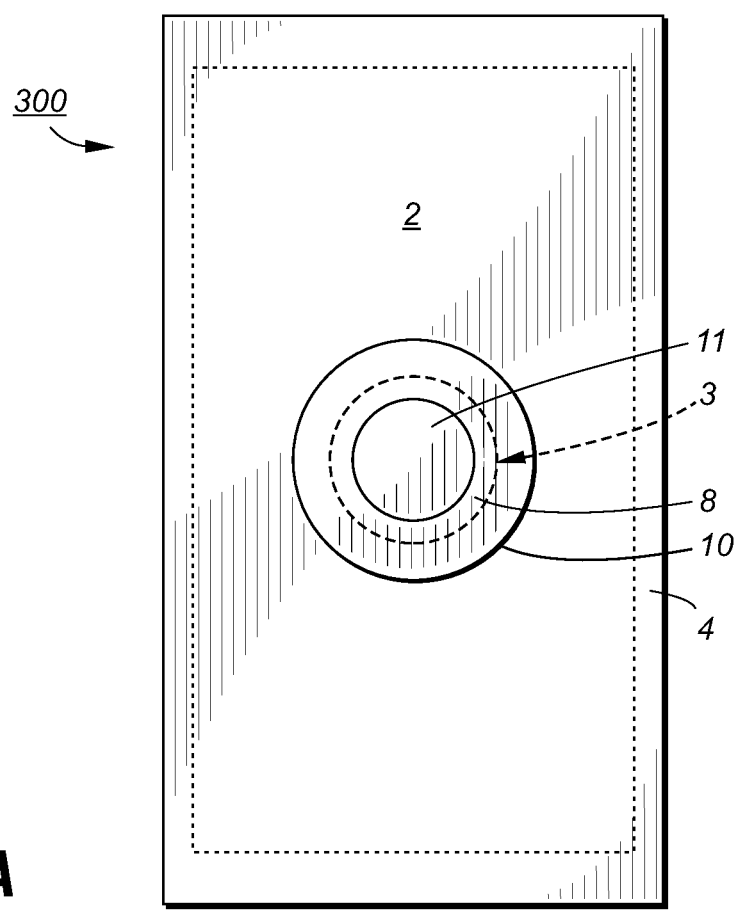
FIGS. 4A and 4B are bottom and side views of an OLED panel with a pass-through hole with a solid element that has a flange that supports on the OLED panel on one end.
Figure 4B:
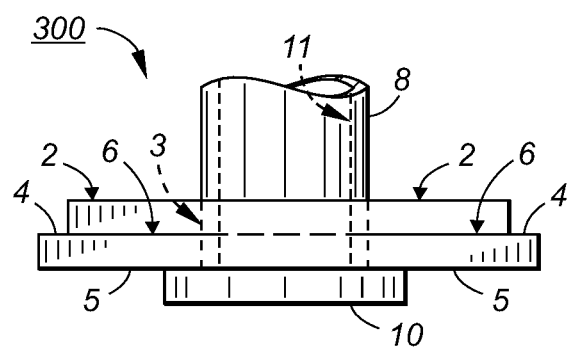
Figure 4C:
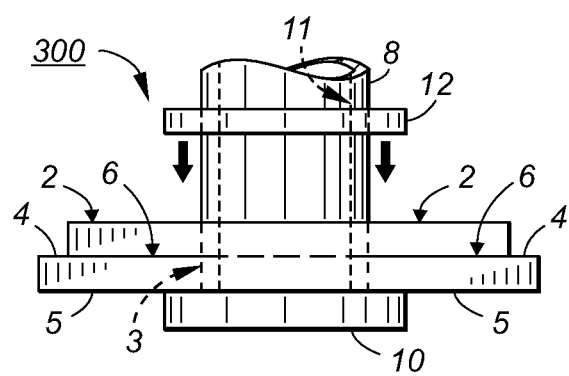
FIG. 4C shows where a collar is dropped down over the solid element of FIG. 4B in order to lock the OLED panel is place.

The solid element 8 may provide a mechanical support function to the OLED panel. For example, as shown in FIGS. 4A and 4B, the solid element 8 may have a flange or flair 10 on one end that supports the OLED panel 300 when the solid element 8 is placed through the pass-through hole 3. In this example, the solid element 8 is a tube and is hollow inside as indicated by 11. Moreover, in this example, there is no gap 9 and the solid element 8 is sized to fit the pass-through hole 3. FIG. 4C shows a related embodiment where a ring-shaped collar 12 is dropped over the solid element 8 and pushed down (as shown by the arrow) to the emission surface 2 of the OLED panel 300 to lock the OLED panel 300 in place. Although this example uses a circular flange and collar arrangement, other arrangements such as tabs, hooks, pins, magnets and the like for having the solid element support the OLED panel on one or both sides can be used.

Figure 5:
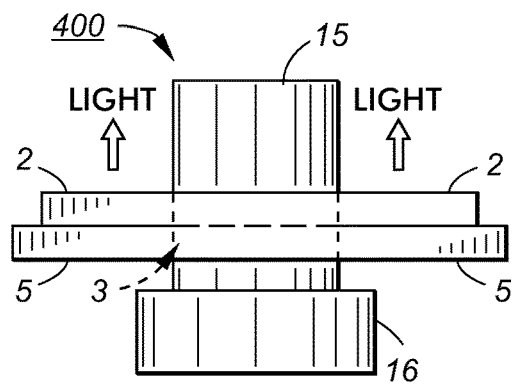
FIG. 5 shows a side view of a camera lens used as a solid element arranged in the pass-through hole of an OLED panel.

In some designs, the solid element that is within the pass-through hole may provide a function that utilizes the light emission from the surrounding parts of the OLED. For example, a camera lens could poke through the pass-through hole so that surrounding emission from the OLED panel would provide a very uniform lighting field for the camera. In this case, the camera lens would represent a certain type of solid element. Together they would form a combined camera and lighting unit 400. This is illustrated in FIG. 5 which shows a camera lens 15 which extends through the pass-through hole 3 where the camera lens 15 is part of a camera body 16. The direction of light emission from the OLED emission surface 2 is indicated by arrows. Alternatively, the camera lens 15 could be set back from the pass-through hole 3 so that the camera lens 15 just receives light through the pass-through hole 3. Although this example illustrates the use of a camera, other types of sensors or detectors may be used as well.

Figure 6:
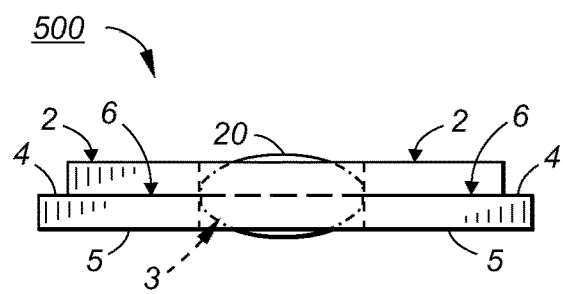
FIG. 6 shows a side view of an optical lens used as a solid element arranged in the pass-through hole of an OLED panel.

In another design, the solid element 8 within the pass-through hole 3 could provide a light management function. For example, the solid element could be an optical lens. In this case, the optical lens, which is transparent, would represent a certain type of solid element. This is shown in FIG. 6 where a combined OLED panel/optical lens unit 500 has an optical lens 20 located within the pass-through hole 3. Alternatively, the solid element within the pass-through hole that provides a light management function could be a mirror, a color filter or a transparent or light-scattering piece of glass or plastic.

In some designs, the solid element 8 may be movable. For example, the solid element 8 may be enabled to wiggle or rotate in place. In other designs, the solid element 8 may be moving through the pass-through hole to create a kinetic design.

The OLED panel with a pass-through hole may emit light in a single direction or in two directions at the same time. Alternatively, two OLED panels, each with corresponding pass-though holes may be placed back-to-back. In such cases, the two back-to-back panels may share a single solid element that passes through both.

Figure 7:
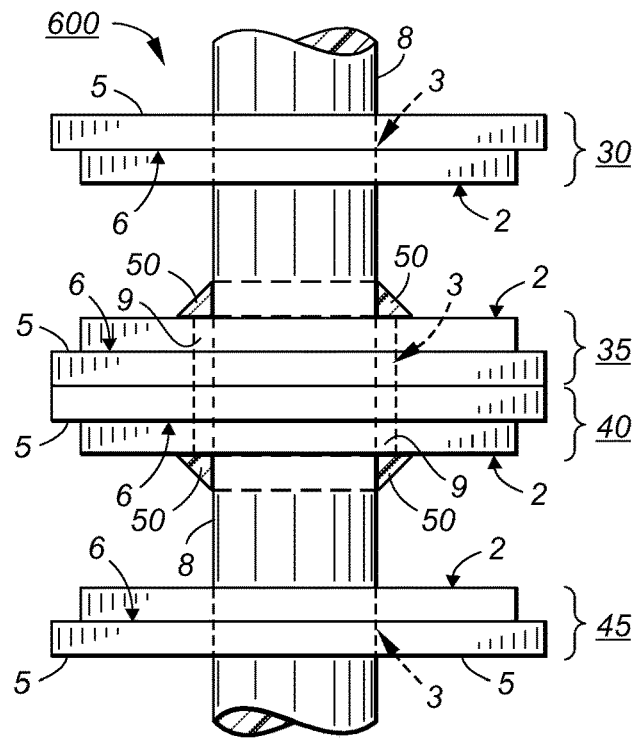
FIG. 7 shows a side view of a single solid element that extends through the pass-through holes of four different OLED panels.

Moreover, a single solid element may extend through the pass-through holes of more than one OLED lighting panel. An illustration of such an arrangement is shown in FIG. 7. In this example, arrangement unit 600 has four OLED panels 30, 35, 40 and 45, each of which has a pass-through hole 3. OLED panels 35 and 40 are back-to-back so that the emission areas 2 face opposite directions. OLED panel 30 is arranged so its emission area 2 faces OLED panel 35 and OLED panel 45 is arranged so that its emission area 2 faces OLED panel 40. In this example, a single solid element 8 extends through the pass-through holes 3 of OLED panels 30, 35, 40 and 45. Note that the pass-through holes 3 of OLED panels 35 and 40 are larger in width than the solid element 8 so there is a gap 9. Braces 50 fix the location of OLED panels 35 and 40 on the solid element 8. As shown, the pass-through holes 3 of OLED panels 30 and 45 have the same width of the solid element 8 and so do not need to be fixed in position.

It is also possible that more than one solid element can extend through a single pass-through hole, so long as there is sufficient space. A single OLED panel with more than one pass-through hole can have one solid element that passes through at least two holes, or there may be more than one solid element, each of which extends through a separate pass-through hole. The OLED panel with the pass-through hole has an OLED light-emitting unit on an OLED substrate. The OLED light emitting unit refers to a complete light-emitting unit located on an OLED substrate. A complete light-emitting unit will have at least a first electrode, electroluminescent layer(s), and a second electrode, all fully covered by encapsulation to prevent contact with air and water.

The OLED substrate can be rigid and made of glass, metal or rigid plastic. Alternatively, the OLED substrate is flexible and can be made of flexible glass, metal or polymeric materials. Metal, glass or flexible glass are most desired. Generally speaking, it will be flat with a uniform thickness. In some cases, it may be necessary to provide features in the substrate in order to increase flexibility. If the substrate is flexible glass, the glass edge may be thermally treated to remove any surface defects. Defects such as nicks or defects in the glass edge can be the origin or starting points for glass breakage under stress. Heat treatment can prevent this by removing any defects and so, increase effective bendability without breaking. For bottom emitting OLEDs, the substrate should be transparent. For top emitting OLEDs, the substrate may be opaque or transparent (allowing for two-sided emission) as desired. The top surface of the substrate is that facing the OLED unit. Since the substrate will be part of the overall encapsulation for the OLED, it should be sufficiently impervious to air and water so that the OLED will have desired lifetime. The OLED substrate may have various types of subbing layers which may be patterned or unpatterned and can be either on the top or bottom surfaces.

In the OLED unit, there is a first electrode that covers the top surface of the substrate and desirably completely covers the top surface of the substrate. The first electrode can be an anode or a cathode and can be transparent, opaque or semi-transparent. Desirably, the first electrode is a transparent anode and the OLED device is a bottom emitter. The transparent first electrode should transmit as much light as possible, preferably having a transmittance of at least 70% or more desirably at least 80%. However, in some applications (i.e. microcavity devices), the transparent first electrode may only be semi-transparent and have partial reflectivity. While the first transparent electrode may be made of any conductive materials, metal oxides such as ITO or AZO or thin layers of metals such as Ag are preferable. In some cases, there may be an auxiliary electrode to help distribute charge more uniformly across the full plane of the transparent electrode.

Organic layers for light-emission will be deposited and will be in contact with the first electrode. At least one organic layer will be electroluminescent. There may be more than one layer and some layers may not be light-emissive. Formulations and layers appropriate for OLED type light emission are well known and can be used as desired. The organic layers may be small molecule or polymeric. The organic layers may be deposited by any known method including vapor deposition, solution coating, ink-jet techniques, spraying and the like. The organic layers may be patterned. Inorganic electroluminescent materials such as quantum dots could also be used for light emission. Because such formulations also include organic materials, the use of inorganic electroluminescent materials can be considered as an OLED for the purpose of the invention. The organic layers can also include various other layers well-known in the art, including but not limited to hole-injecting, hole-transporting, electron-injecting, and electron-transporting layers.

Over the organic layers, there is a second electrode. It may be an anode or a cathode; preferably a cathode. The second electrode may be transparent or opaque, preferably opaque. If transparent, it is desirably composed of conductive transparent metal oxides such as ITO or thin layers of metals such as Ag. If opaque, it is desirably composed of a thicker layer of metal or metal alloy such as Al, Ag, Mg/Al, Mg/Ag and the like. The second electrode may be deposited by any known technique.

Over the second electrode, there may optionally be a protective organic layer, protective inorganic layer, or a combination of both. This is to prevent damage to the second electrode and underlying organic layers during encapsulation.

The OLED light-emitting unit should be fully encapsulated. The encapsulation is provided on one surface by the substrate. The sides and top of the OLED unit can be encapsulated by a rigid or flexible impervious cover that is affixed to the substrate to seal the OLED unit. Most desirably, the encapsulation of the sides and top of the OLED unit is provided by thin-film encapsulation. Thin-film encapsulation typically includes multiple (for example, 4 or more) alternating layers of inorganic and organic materials. There are electrically conductive extensions of the first and second electrodes that will extend through the encapsulation and form contact pads for external electrical connection. Since the substrate is part of the OLED encapsulation, it may be necessary to add additional thin-film encapsulation such as barrier layers on either side of the substrate to provide additional protection. The additional barrier layer(s) may be the same as that applied over the OLED unit or made of different materials.

The OLED panel can be suitable for general lighting applications. It may be suitably modified for use in specific applications. For example, it may be fitted with a lens to concentrate the emitted light in order to act as highlighting or it may be fitted with filters to adjust the color temperature of the emitted light. It may be directly used as part of a specific luminaire design or may be used as the light source in a lighting module which can be used interchangeably between different luminaire designs.

The OLED lighting panel has at least one light-emissive face or surface. The opposite face or surface of the OLED panel can be non-emitting so that the OLED panel has single sided emission. The opposite face or surface can also be light-emitting so that the OLED panel has dual sided emission. The light-emitting surface(s) can have emissive areas and non-emission areas, not including the pass-through holes. Desirably, the non-emissive areas will surround a single emissive area but have a total non-emissive area less than the emissive area. It is most desirable that the OLED panel has single sided emission where the non-emitting areas around the emitting area are as small as possible.

The OLED panel may have an optional light management unit which serves a number of purposes and may be composed of multiple layers. It may be rigid or flexible. Its primary purpose is to increase the amount of light scatter of the light being transmitted through the OLED substrate, thus improving light distribution from the device and improving overall efficiency. Generally, the flexible light management unit will have a light scattering medium located either on the surface or within a flexible polymeric or glass substrate or the flexible substrate will contain physical structures (for examples, bumps or projections of various shapes) that cause light scattering. In some cases, the flexible light management unit may be part of the same substrate as the OLED unit. In other cases, it may be a separate unit that is applied to the light-emitting surface of the OLED unit/ substrate using an optically clear adhesive. In addition to its light management function, it will also help to protect the surface of the device from damage. There may be a pass-through hole in the light management unit that corresponds to the pass-through hole in the OLED panel.

OLED panels can be used as a light source in a luminaire or lamp. Luminaires are used in many ways; for example, overhead lighting such as chandeliers, wall lighting such as sconces or table lighting such as desk lamps. In order to minimize production costs, it is often desirable to incorporate the OLED lighting panel in a modular design that can be used in many different styles of luminaires. An OLED lighting module would be a set of standardized parts or independent units that can be used to construct a more complex structure using an OLED lighting panel as the light source.

Generally speaking, an OLED module would have at least three parts: a bottom housing or support, an OLED lighting panel in the middle and a top housing or bezel with an opening for light emission. The bottom housing may also have an opening for light emission as well if using an OLED panel that emits light from two sides or if two OLED light panels are used back-to-back. In some instances, the top and bottom housing are formed as one integral piece, in which case the OLED panel is placed into the module through a side opening. To maintain a slick and neat appearance, the external electrical connections are usually hidden within the module and external electrical connections are through a standardized non-permanent connection point such as an electrical jack or plug. This is consistent with a modular design. The lighting module should also have some allowance for mechanical support and/or attachment to the body of the luminaire. The module may be rigid or flexible and may be made of any suitable material such as plastic or metal.

Figure 1A:
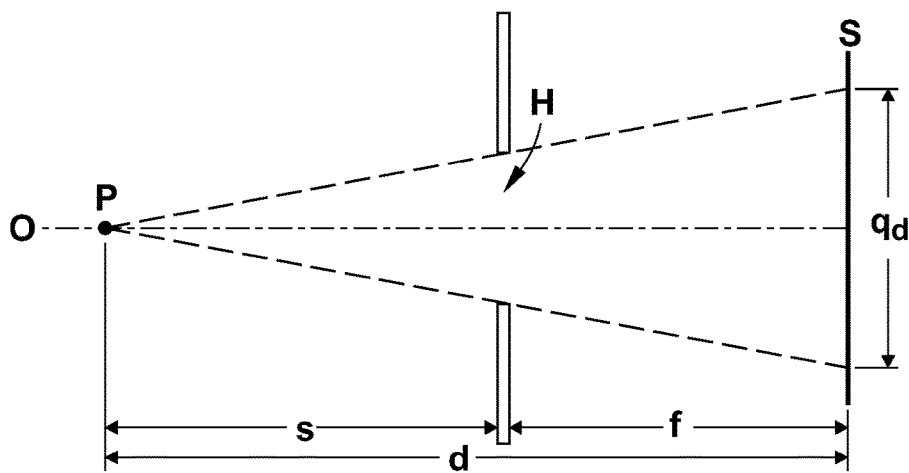
FIGS. 1A-1C are schematic illustrations of the relationship of the size of a hole opening to the visibility of objects behind the hole.
Figure 1B:
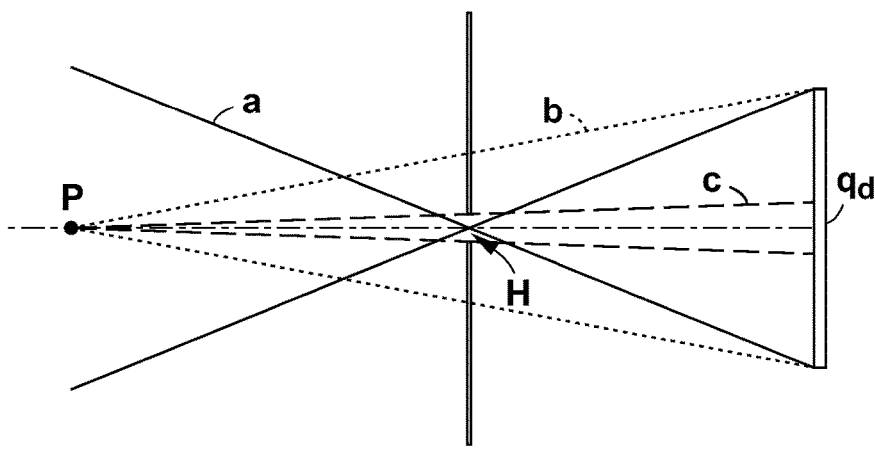
Figure 1C:
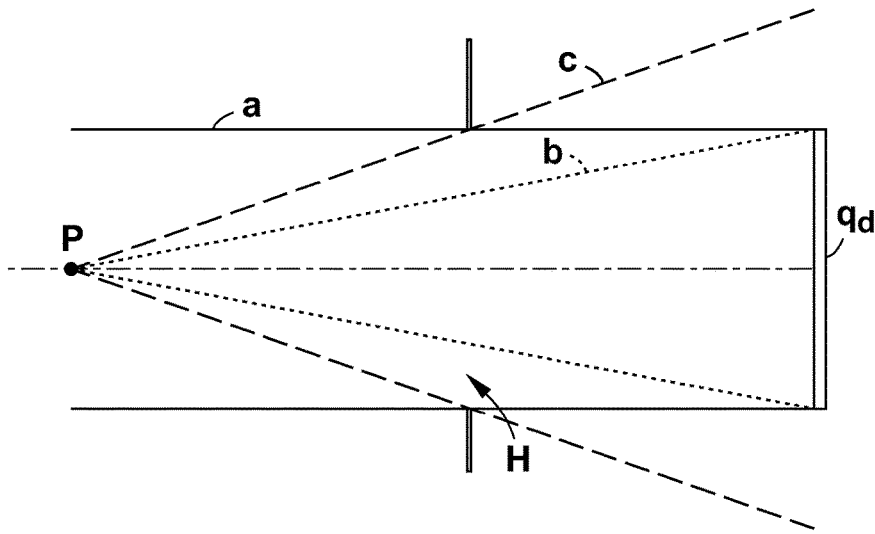
Figure 8A:
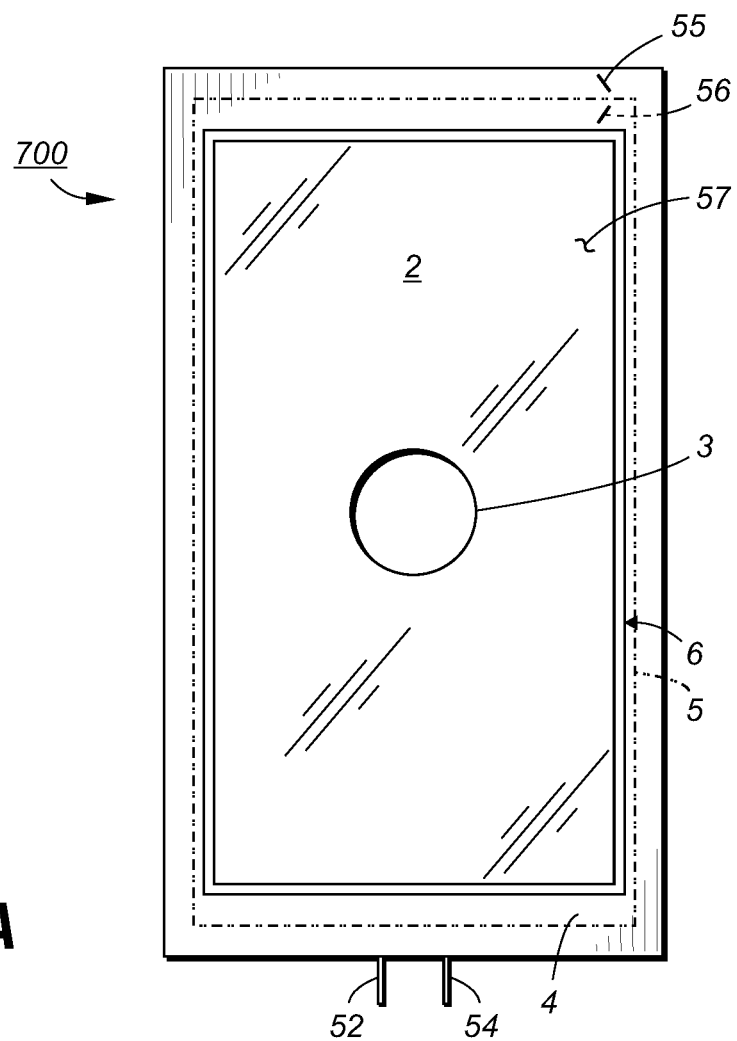
FIGS. 8A and 8B show overhead and side views of an OLED module incorporating an OLED panel with a pass-through hole.
Figure 8B:
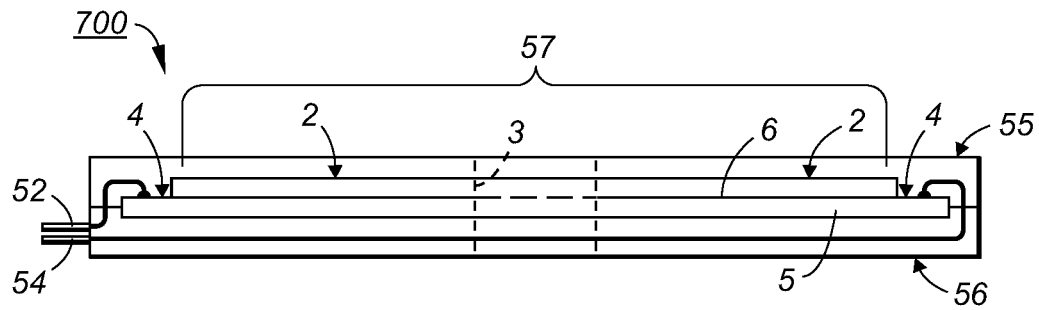

If the OLED panel with a pass-through hole is incorporated as part of a module, the module may have corresponding pass-through hole(s) as well if desired. If the OLED panel has a solid element that extends through the pass-through hole of the panel, then the OLED module will require an opening for the solid element to extend through as well. FIGS. 8A and 8B are top and side views of one embodiment for an OLED module 700. There is an OLED panel 100 (as in FIGS. 1A and 1B) with an OLED substrate 5 and an OLED light-emitting unit 6 between a top housing 55 and a bottom housing 56. In this example, there are aligned pass-through holes 3 in the OLED panel and the top housing 55 and bottom housing 56. There is a transmissive opening 57 in the top housing 55 for light emission from the emitting surface 2 of the OLED panel. There are electrical connections 52 and 54 that run from internal electrode contact pads (not shown) located on the non-emitting border 4 of the OLED substrate 5 along the non-emitting side of the OLED panel 100 and exit the module on its side. The transmissive opening 57 in the top housing 55 may be open so that the emissive surface of the OLED panel is exposed or it may be covered with a light management unit such as a diffuser, optical lens, color filters, etc. There may be a pass-through hole in any covering that corresponds to the pass-through hole of the OLED panel. In some embodiments, the bottom housing may have a transmissive opening as well. This also may be covered with a light management unit with a pass-through hole if desired.

Figure 9A:
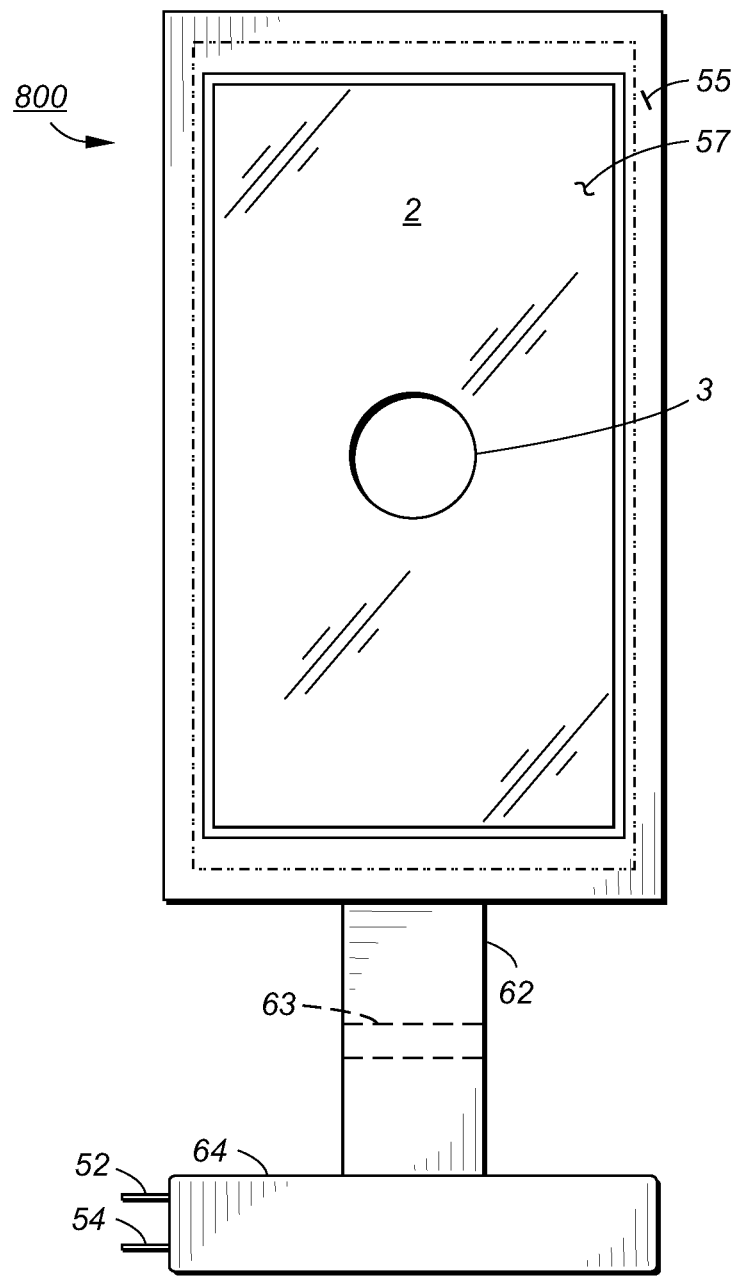
FIGS. 9A and 9B show front and back side views of a desk lamp type luminaire using an OLED module with an OLED panel with a pass-through hole.
Figure 9B:
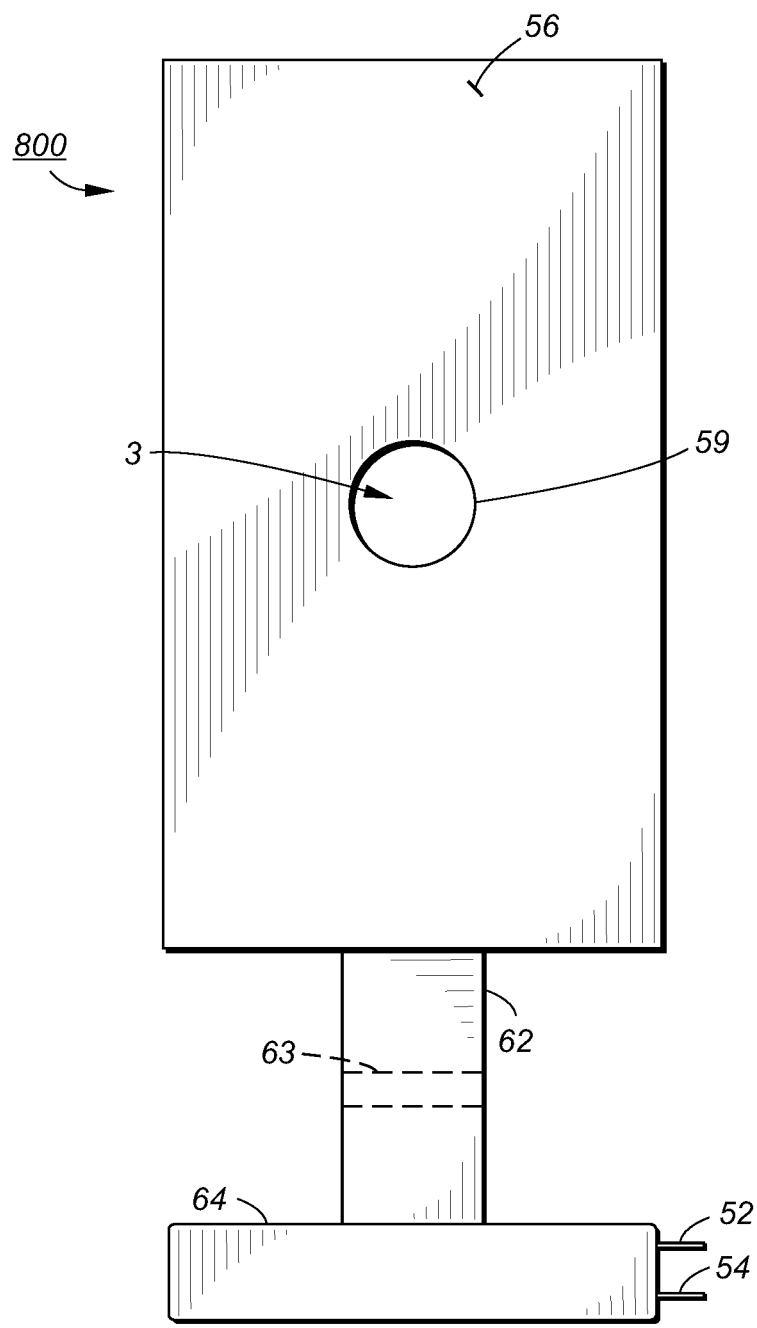

For luminaires using OLED modules with OLED panels with just a pass-through hole, the pass-through hole is left empty and is an integral part of the overall design and appearance of the luminaire. One such design is shown in FIGS. 9A (front view) and 9B (back view). The luminaire is in the form of a desk lamp 800 utilizing the OLED module 700 illustrated in FIGS. 8A and 8B. The top housing 55 has an opening 57 through which the emission surface 2 and pass-through hole 3 of the OLED panel 100 can be seen. The entire OLED module 700 is supported by luminaire support arm 62 which is connected to luminaire base 64. The luminaire support arm 62 has a bendable joint 63 that allows the angle of the OLED module to be adjusted. The electrical connectors 52 and 54 run from the electrode contact pads of OLED panel 100 through the housing of the OLED module and luminaire support arm 62, the luminaire base 64 and eventually to an external power source (not shown). As can be seen in FIG. 9B, there is an opening 59 in the bottom housing 56 that corresponds to the pass-through hole 3 in the OLED panel 100 within the OLED module 700.

Note that in this example, the bottom housing 56 has a hole that matches the size and shape of the pass-through hole 3 in the OLED panel 100. However, this is not limiting. The bottom housing may be solid (in which case, the front face of the bottom housing behind the pass-through hole would be visible from the emission side of the OLED module) or have an opening that is a different size or shape from the pass-through hole in the OLED panel within the module.

Figure 10:
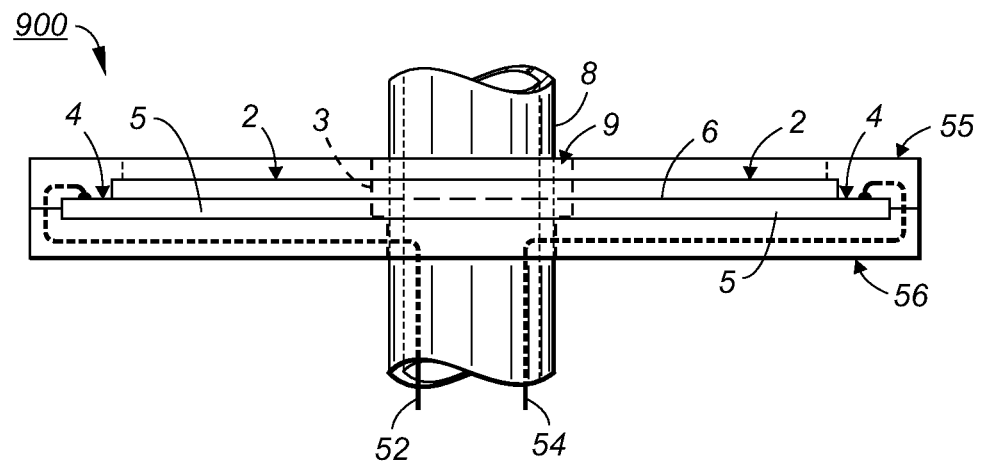
FIG. 10 shows a cross-sectional view of an OLED module with a hollow solid element that extends through pass-through holes in the OLED panel and the OLED module.

FIG. 10 shows a side view of an embodiment of an OLED module 900 related to the OLED module 700 shown in FIGS. 8A and 8B. In this embodiment, there is a hollow solid element 8 through which electrical connectors 52 and 54 of the OLED module extend to a power source. Note that in this case, the width of the pass-through hole 3 in the OLED panel 100 is greater than the solid element 8 so there is a gap 9 between them, but the width of the pass-through hole in the bottom housing 56 in the OLED module 900 is the same as the solid element 8. This arrangement allows for a fixed mounting of the OLED module on the solid element 8 using the housing of the OLED module 900 and not the OLED panel 100. Using electrical connections hidden within the OLED module 900 and lead out through holes (not shown) in a hollow solid element 8 within the housing allows for a sleek appearance where the electrical connectors are not visible.

For luminaires using OLED modules with OLED panels with a solid element that extends through a pass-through hole, the solid element becomes part of the overall design and appearance of the luminaire. In such a case, it is preferred that the solid element provides mechanical support for the OLED module.

Figure 11:
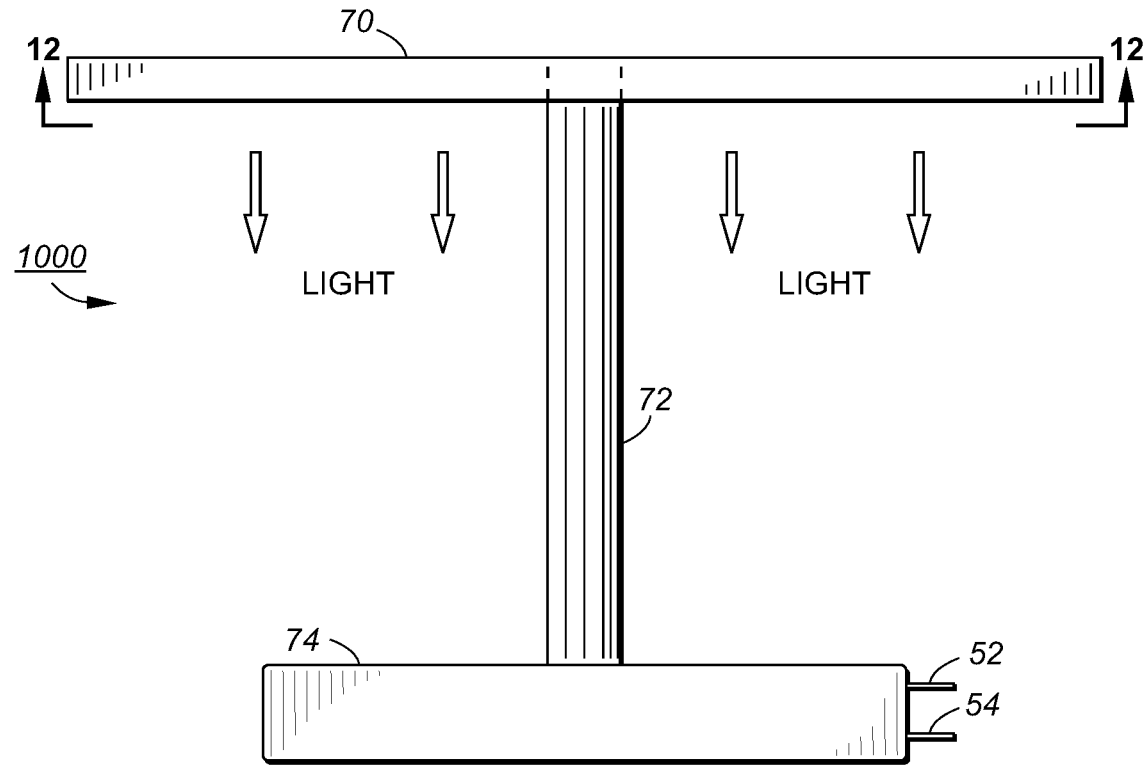
FIG. 11 shows an example of a desk-lamp type luminaire using an OLED module with an OLED panel with a pass-through hole and a solid element that extends through the pass-through hole of the OLED panel.

A luminaire using an OLED module is shown in FIG. 11. In this example, the luminaire 1000 has an OLED module 70 with an OLED panel similar to 100 (as shown in FIGS. 2A and 2B) affixed to the top of a luminaire support arm 72 which sits upon a luminaire base 74. Arrows indicate the direction of light emission.

Figure 12:
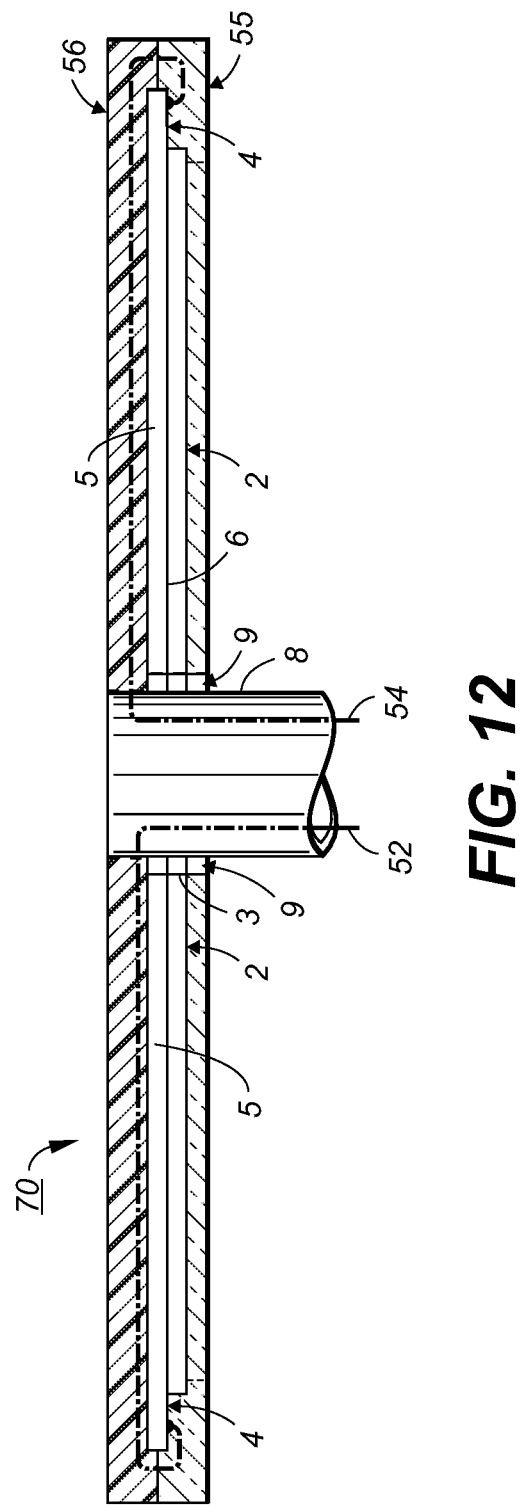
FIG. 12 shows a cross-sectional view of the OLED module used in the luminaire illustrated in FIG. 11.

FIG. 12 is a cross-sectional view of the OLED module 70 which is part of the luminaire 1000 shown in FIG. 11. The OLED panel 100 within the OLED module 70 is represented by the OLED substrate 5 and OLED light-emitting unit 6 with emission area 2 and pass-through hole 3. The OLED module is represented by the top housing 55, which has an opening 57 for light emission from the OLED panel, and the bottom housing 56. In this example, luminaire support arm 72, which represents a solid element that is hollow on the inside, extends through the pass-through hole 3 of the OLED panel and is mechanically connected to the front face of the bottom housing 56. In this example, the cross-sectional area of the luminaire support arm is smaller than the cross-sectional area of the pass-through hole, so there is a continuous gap 9 between the two. The electrical connectors 52 and 54 run from the electrode contact pads of the OLED panel through the housing of the OLED module and luminaire support arm 72. Note that in this example, the OLED panel with the pass-through hole is supported by the OLED module and not directly by the luminaire support arm (the solid element). The luminaire support arm 72 provides mechanical support to the OLED module 70.

Figure 13:
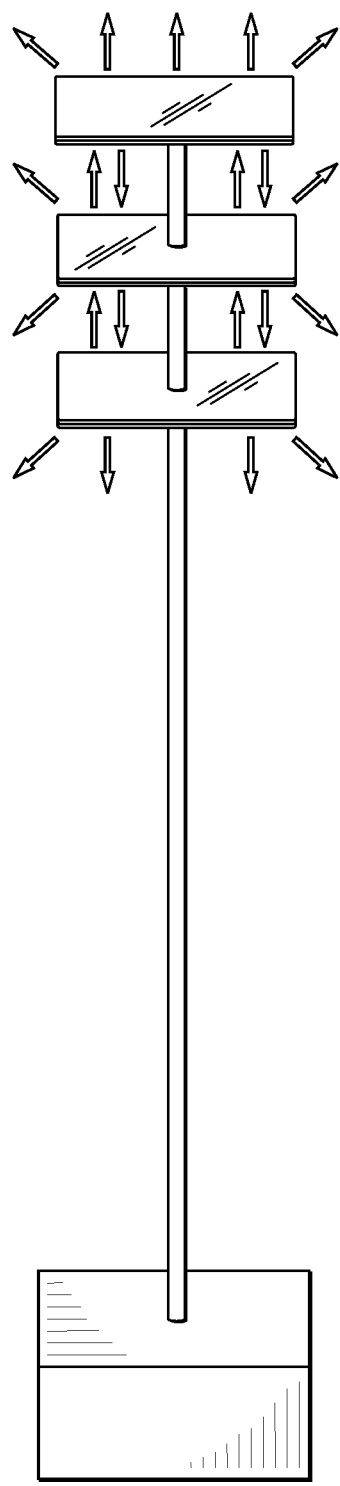
FIG. 13 shows a standing luminaire design that uses OLED modules with OLED panels, which have pass-through holes, as the light source.

FIG. 13 is a view of another example of a luminaire which uses OLED modules with OLED panels with pass-through holes. In this example, there are three OLED modules all supported by a single luminaire support arm. All three OLED modules feature 2 OLED panels located back-to-back within the module so that there is light emission on both sides of the OLED module. In the topmost OLED module, only the lower OLED panel has a pass-through hole while the upper OLED panel has none. The luminaire support arm that supports the topmost OLED module is connected to a plate between the two OLEDs within the module so it does not extend through the upper OLED panel. This demonstrates that different kinds of OLED panels can be used within the same module. The other two OLED modules have pass-through holes in all of the OLED panels as well as the OLED module housing.

Figure 14:
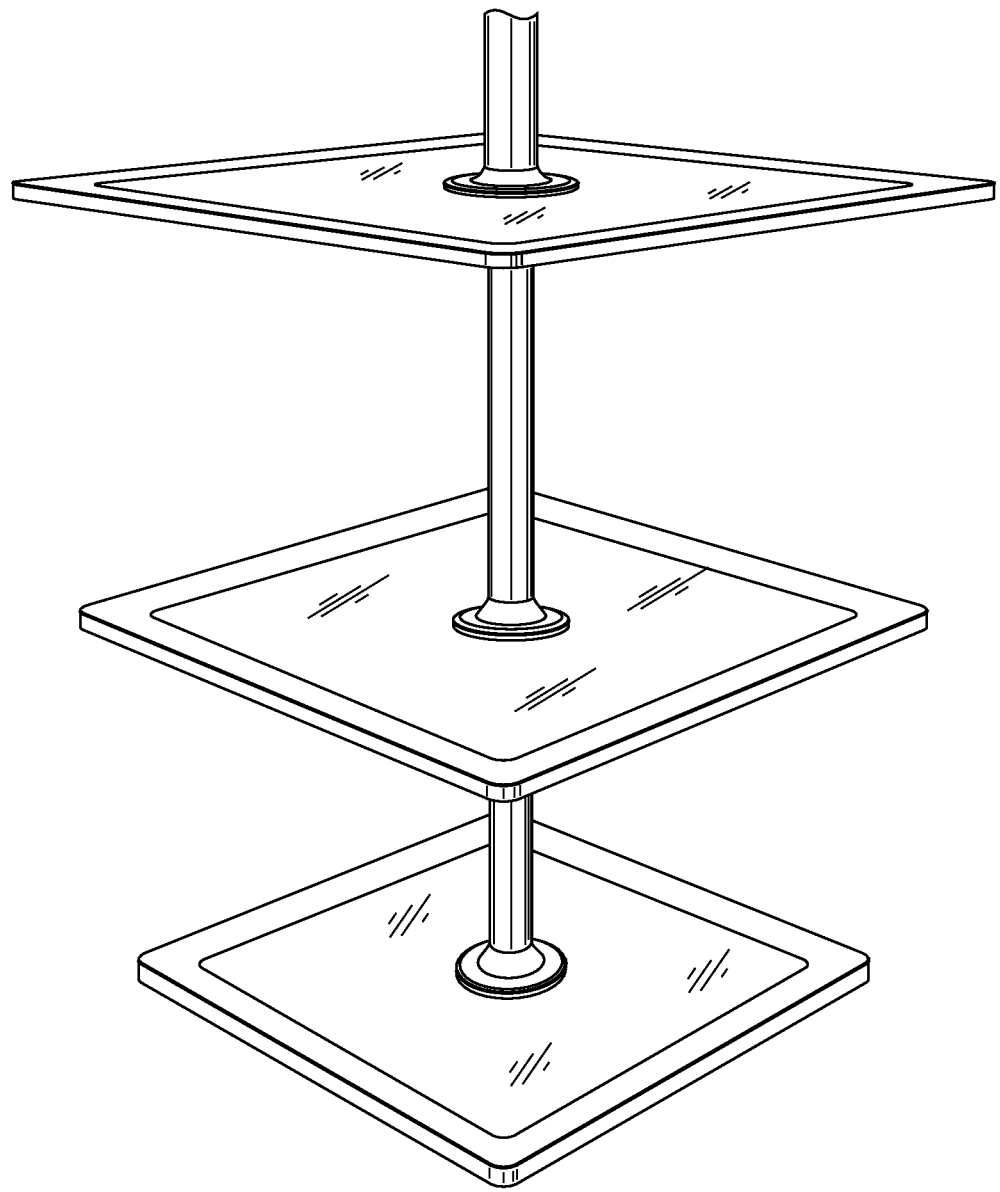
FIG. 14 shows a chandelier that hangs from a ceiling that uses OLED modules with OLED panels, which have pass-through holes, as the light source.

FIG. 14 is a close-up view of chandelier that hangs from a ceiling that uses OLED modules with OLED panels with pass-through holes as the light source. Note the use of collar-type retaining rings, also herein called braces, to fix the location of an OLED module on a luminaire support arm.

There are many ways to form a pass-through hole in a pre-formed and fully encapsulated OLED panel. Some suitable methods of creating an opening in an OLED include drilling, grinding, scoring, die-punching, sawing, laser cutting, ultrasonic cutting, waterjet cutting or plasma cutting. However, any such methods will, at a minimum, break the OLED encapsulation by creating cut edges where the internal layers will be exposed to the atmosphere. Moreover, the internal organic and electrode layers of the OLED are thin and not physically robust. They may shear or deform at and near the edges of the holes during hole formation. This is of particular concern for the electrode layers which may short circuit if they come into contact with each other during hole formation. This will cause the OLED to become nonfunctional. In additional, some of the organic materials used in OLEDs can be temperature sensitive or volatile at high temperatures. Of the above methods, drilling, ultrasonic cutting and laser cutting are preferred.

An example of suitable laser cutting process would use an IRR femtosecond laser. In particular, the pass-through hole in the OLED panel may be made using laser ablation, water-jet cutting, plasma cutting, CNC, EDM, and the like, though in some cases techniques other than laser ablation and the like may be too destructive for very thin plastic substrates. Thus, in some embodiments, laser cutting processes such as laser ablation may be preferred. Relative to other methods, laser ablation is a non-contact technique which causes little or no damage to the organic devices. Laser ablation may be especially effective in removing metals, since metals strongly absorb laser energy. The difference in energy absorption behavior between organics, oxides and metal materials can be explored to optimize the process condition. $CO_2$ or Nd-YAG pulsed lasers can be used to remove cathode material. Further, laser power and wavelength can be changed to control etch depth and provide material selectivity.

It is also possible that the pass-through hole may be formed in a multistep process. For example, etching or laser ablation may be used to remove the some or all of the layers overlying the substrate in a first step, and then the pass-through hole is completed by cutting the substrate and any remaining layers in a second step. Since wet solutions typically cannot be used on completed OLEDs, dry etching techniques may be applied. However, dry etch involves highly reactive chemicals and high energy plasmas, which may damage some OLED devices.

Laser cutting techniques also may be used to cut through a substrate. Under laser irradiation, many common substrate materials melt, burn, or vaporize, resulting a clean cut. Other cutting processes also may be used to cut through a substrate. For example, a mechanical blade or knife, such as the Graphtec FC4500 flatbed cutter, may be used to cut the substrate. Such techniques may have an advantage in causing little or no debris.

Advantages of laser cutting over mechanical cutting include easier workholding and reduced contamination of the workpiece, since there is no cutting edge which can become contaminated by the material or contaminate the material. The precision available with laser cutting techniques may be higher and/or more consistent, since the laser beam does not wear during the process. There is also a reduced chance of warping the material that is being cut, as laser systems have a small heat-affected zone. Some materials are also very difficult or impossible to cut by more traditional means.

Because water and oxygen are deleterious to the materials used in OLEDs, it is preferred to form the pass-through hole through the OLED encapsulation under conditions that are as free from water and oxygen as possible. This may involve forming the pass-through hole under an inert atmosphere in a sealed environment or at least under a blanket of inert and/or dry gases.

In any case, once the pass-through hole is formed through the encapsulation of an existing fully encapsulated OLED, the encapsulation should be re-established as soon as possible. A known method would be to apply a sealant that is a moisture and oxygen barrier to the newly exposed edges of the pass-through hole. However, it is difficult to apply a thick enough layer of sealant to the edges to provide sufficient encapsulation. Because the cut edges may be rough and irregular, it is also difficult to apply the sealing material in a uniform and continuous unbroken layer. Finally, access to the cut edges within the pass-through hole may be limited and so, there can be problems with mechanically applying a sealant to the cut edges. This problem can be solved by the use of a support element above or within the pass-through hole which is attached to at least one of the faces of the OLED panel. The support element allows for the uniform application of a thick layer of sealant along the cut edge (side wall) of the pass-through hole. It holds the sealant in position along the surface of the side wall until it can be cured or solidified.

The support element can be rigid or flexible. It can be opaque or transparent. It can be pre-formed or formed in-situ. Desirably, the support element serves as a barrier to water and has a water vapor transmission rate (WVTR) of $10^{-6}$ g/m$^2$/day or less. Desirably, the support element is also a barrier to oxygen and has an oxygen transmission rate of $10^{-4}$ g/m$^2$/day or less. Desirably, the support element is made of metal such as aluminum or stainless steel, made of plastic such as metallized polyester, PEN or PET, or made from a barrier coated polymer film.

In some embodiments, the support element is sized to fit at least partially within the pass-through hole and designed so part of the support element is spaced at a desired distance from the side wall of the pass-through hole. This leaves a space between the support element and side wall of the pass-through hole that can be filled with sealant. By "within" the pass-through hole, it is meant that at least some part of the support element lies between the planes formed by the two faces of the OLED panel. The center part of the support element may be hollow (thus forming a second, smaller pass-through hole) or may be solid (thus filling the pass-through hole).

Figure 15A:
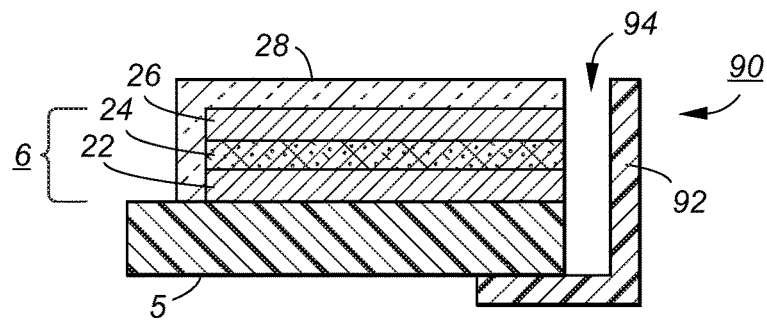
FIGS. 15A-15D demonstrates the use of a bushing to allow sealant to encapsulate the cut side-edge of a pass-through hole.

FIGS. 15A-15D shows examples of one method for sealing a cut side-edge of an opening in an OLED illustrating the use of a support element within the pass-through hole. In these figures, the view is a cross-section along the line 15/15 as shown in FIG. 2A. FIG. 15A shows the cut edge of the pass-through hole where the OLED substrate is 5, and the OLED light-emitting unit 6 is divided into first electrode 22, organic layer(s) 24, second electrode 26 and encapsulation 28. Note that along the cut edge, the organic layer(s) 24 is exposed to the atmosphere and is no longer protected by the encapsulation 28. A bushing 90 with a lip 92 of the same shape as the pass-through hole has been inserted into the hole opening so part of the busing 90 makes direct contact with the OLED substrate 5. The lip 92 of the bushing 90 is sized to fit within the hole opening leaving a gap 94 between the lip 92 and the cut edge. The bushing 90 is made of materials that serve as a water and air barrier such as metal or a laminated film and formed into the desired shape.

Figure 15B:
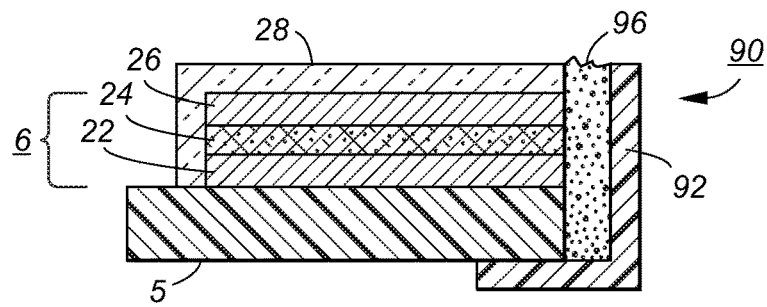

FIG. 15B shows where the gap 94 has been filled with a sealant 96 that forms a barrier to air and water. This establishes full encapsulation of the organics layer(s) 24. If greater protection of the organic(s) layer is needed, the gap 94 can be made wider or the length of the lip 92 be increased so that is above the encapsulation layer 28 in order to create a thicker seal between the top of the lip and upper surface of the encapsulation layer.

Figure 15C:
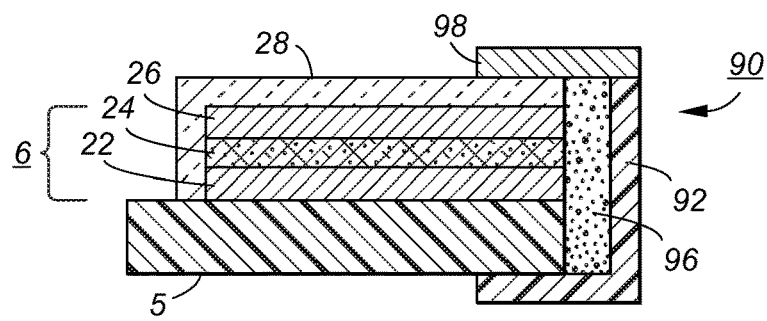

FIG. 15C shows where a second air and water barrier film 98 made of materials such as metal or laminated film has been placed over the top edge of the lip 92, sealant 96 and the surface of the encapsulation 28. This establishes full encapsulation of the organics layer 24.

Figure 15D:
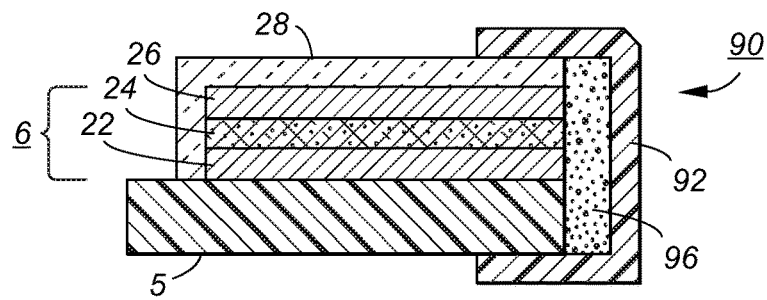

FIG. 15D shows yet another variation where a long lip 92 has been folded over or crimped to contact the surface of the encapsulation 28 after the sealant 96 has been introduced into gap 94.

In some embodiments, the support element is located above the side walls of the pass-through hole. By "above", it is meant that that no part of the support element is below the planes formed by the two faces of the OLED panel. Thus, the support element is in contact with one of the faces of the OLED panel and extends out (in a parallel direction of the face) over and past the edge of the pass-through hole. This forms a ledge which can support the sealant along the side wall. In some cases, the support element can span the entire area of the pass-through hole. That is, the support element can fully extend across the opening of the pass-through from one side to the other in all directions.

Another method that can be used to re-establish the encapsulation after formation of the pass-through hole in a preformed OLED panel would be that once the pass-through hole is formed, the OLED panel is then laminated between two films (support elements) that are oxygen and water barriers over the pass-through hole. The two barrier films can then be pressed together within the pass-through hole or the pass-through hole filled with sealant after one barrier film is applied but before the other is applied. Finally, a new slightly smaller pass-through hole is formed through the two barrier films (and sealant if present). This encapsulates the edges of the first formed pass-through hole in the OLED panel by leaving them covered with either barrier film or by a layer of sealant between the two barrier films. The sealant can be applied only along the side wall of the pass-through hole after one barrier film is laminated to the face of the OLED panel or the sealant can fill the entire pass-through hole. It is also possible to apply the sealant to the barrier films before application to the OLED panel. In this case, the sealant also acts as an adhesive.

Figure 16A:
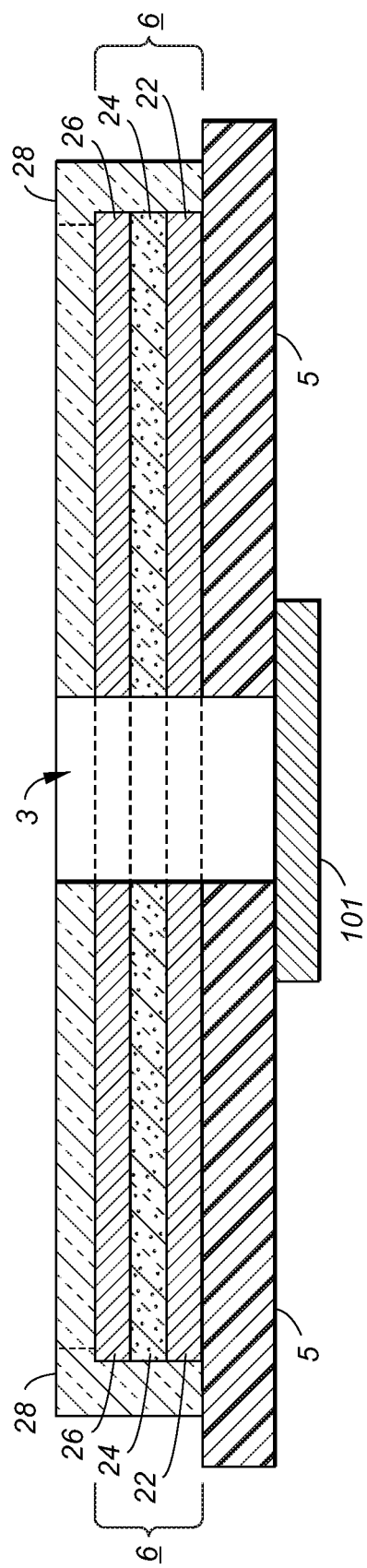
FIGS. 16A-16C illustrate the use of first and second barrier films to provide encapsulation for the cut side-edges of a pass-through hole.
Figure 16B:
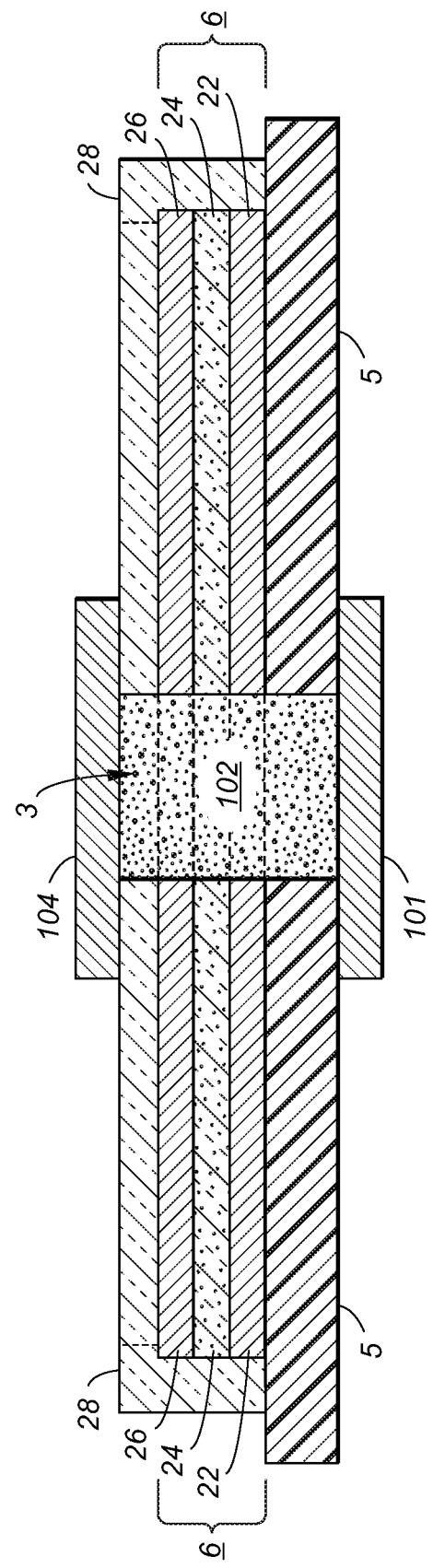
Figure 16C:
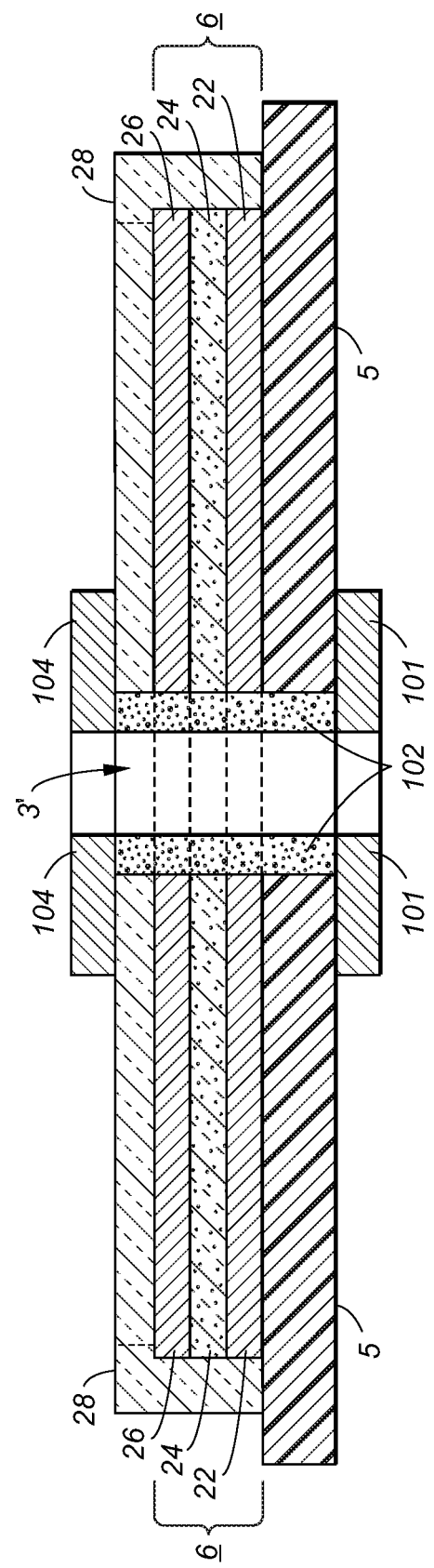

An embodiment of this method using two barrier films as support elements and sealant is illustrated in FIGS. 16A-16C which is a cross-section along lines 16/16 in FIG. 2A where it has been extended to the right side of the OLED panel. FIG. 16A shows where a first barrier film 101 (made of material such as metal or a laminated film) is laminated across the pass-through hole 3 so it makes full contact with the OLED substrate 5 surrounding the pass-through hole 3. FIG. 16B shows a second step where the pass-though hole 3 is filled with sealant 102 and a second barrier film (made of materials such as metal or laminated film) 104 placed over the pass-through hole 3 that is filled with sealant 102 so that it makes full contact with the encapsulation 28 surrounding the pass-through hole 3. FIG. 16C shows where a new pass-through hole 3' has been created through the second barrier film 104, the sealant 102 and the first barrier film 101. The new pass-through hole is smaller in all dimensions than the original pass-through hole and so, leaves a wall of sealant 102 on the cut side-edges of the original pass-through hole. It should be noted that if the barrier films are transparent, it may not be necessary to form a new second pass-through hole. A pass-through hole in the OLED panel of the invention still remains, but in this type of embodiment. is covered by transparent films.

It may be necessary to polish or pre-treat the cut edges of the pass-through hole to improve the re-encapsulation. In such cases, the material used for re-encapsulation can be different from the material(s) used to encapsulate the surface of the OLED panel.

The same materials described below as suitable for use as the sealant may also serve as an adhesive as well and the terms "sealant" and "adhesive" may be used interchangeably. For example, there may be a sealant/adhesive material between the first or second support elements or barrier films (if present) and the top and/or bottom face of the OLED. The sealant/adhesive may be applied in liquid form or in sheet form. The sealant/adhesive may be set by pressure, heat or radiation.

For the above methods for the re-encapsulation of the cut edges of the pass-through hole, any sealant or adhesive that provides a sufficient barrier to oxygen and water can be used. The sealant may be curable or non-curable. Particularly suitable are thermal or UV-curable resins such as those that are silicone or epoxy based. These often will contain additional materials such as moisture-absorbing getter particles or nanoparticles to improve their performance. They can be obtained in transparent and opaque formulations. Such materials are well known and commercially available. They may be applied or deposited by any suitable technique such as screen-printing, spraying, rolling, brushing, etc. for large application areas or by depositing through a nozzle or syringe, ink-jet, etc. for localized or directed applications.

In particular, the sealant for reestablishing the encapsulation the OLED can be a mixture of a curable resin and a moisture absorbent. The moisture absorbent may be present at contents of 5 to 95%, desirably 25% or less, based on the total weight of the moisture absorbent in the sealant. The sealant may also contain other additives or a filler.

The curable resin in a cured state may have a WVTR of 50 $g/m^2/day$ or less, preferably 30 $g/m^2/day$ or less, more preferably 20 $g/m^2/day$ or less, and most preferably 15 $g/m^2/day$ or less. The term "cured state of a curable resin"

refers to a state in which a curable resin may be cured or cross-linked alone or by reaction with another component such as a curing agent so that the curable resin can maintain constant contents of a moisture absorbent and a filler and serve as a structural adhesive when the curable resin is used as an encapsulation material. According to the present invention, the WVTR refers to a WVTR of a cured product which is measured at 38° C. and 100% relative humidity (R.H.) in a transverse direction when the cured product is formed by curing a curable resin and then processed into a film having a thickness of 80 μm. Also, the WVTR is measured according to the ASTM F1249 standard. According to the present invention, as the WVTR of a resin in a cured state is decreased, an encapsulation structure of the resin shows improved performance.

Specific kinds of the curable resin that may be used herein may, for example, include a variety of thermosetting or photocurable resins known in the art, but the present invention is not particularly limited thereto. The term "thermosetting resin" refers to a resin that may be cured by proper application of heat or through an aging process, and the term "photocurable resin" refers to a resin that may be cured by irradiation with electromagnetic waves. Also, a category of the electromagnetic waves described above may include a particle beam such as an α-particle beam, a proton beam, a neutron beam and an electron beam as well as microwaves, infrared rays (IR), ultraviolet rays (UV), X-rays and γ-rays. According to the present invention, one example of the photocurable resin may be a cation-photocurable resin. The cation-photocurable resin refers to a resin that may be cured by a cation polymerization or cation curing reaction induced by irradiation with electromagnetic waves. Also, the curable resin may be a dual curable resin showing both of the thermosetting and photocurable characteristics.

According to the present invention, specific kinds of the curable resin are not particularly limited as long as they have the above-described characteristics. For example, the curable resin that may be cured to give an adhesive property may include resins that contain at least one functional group which can be cured by heat, such as a glycidyl group, an isocyanate group, a hydroxyl group, a carboxyl group or an amide group, or contain at least one functional group which can be cured by irradiation with electromagnetic waves, such as an epoxide group, a cyclic ether group, a sulfide group, an acetal group or a lactone group. In addition, specific kinds of such a resin may include an acryl resin, a polyester resin, an isocyanate resin or an epoxy resin, but the present invention is not limited thereto.

According to the present invention, an aromatic or aliphatic epoxy resin or a linear or branched epoxy resin may be used as the curable resin. According to one exemplary embodiment of the present invention, an epoxy resin having an epoxy equivalent weight of 180 g/eq to 1,000 g/eq may be used as the epoxy resin containing at least two functional groups. The epoxy resin having the above-described epoxy equivalent weight range may be used to effectively maintain the characteristics such as adhesion and glass transition temperature of a cured product. Examples of such an epoxy resin may include a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin or a dicyclopentadiene-modified phenol-type epoxy resin, which may be used alone or in combination.

According to the present invention, an epoxy resin having a ring structure in the molecular structure may be preferably used, and an epoxy resin containing an aromatic group (for example, a phenyl group) may be more preferably used herein. When the epoxy resin contains an aromatic group, a cured product of the epoxy resin has excellent thermal and chemical stabilities and also shows low moisture absorption, which leads to improved reliability of an encapsulation structure of the OLED. Specific examples of the aromatic group-containing epoxy resin that may be used herein may include, but are not limited to, a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloxy-based epoxy resin, a multifunctional epoxy resin, a phenol novolac epoxy resin, a triphenolmethane-type epoxy resin and an alkyl-modified triphenolmethane epoxy resin, which may be used alone or in combination.

According to the present invention, a silane-modified epoxy resin having a silane-modified epoxy resin, preferably an aromatic group, may be more preferably used as the epoxy resin. When the epoxy resin is structurally modified with silane so that it can have a silane group, it is possible to maximize an adhesive property to materials for a glass substrate or inorganic substrate of the OLED and also improve properties such as a moisture barrier property, durability and reliability. Specific kinds of such an epoxy resin that may be used herein are not particularly limited, and the epoxy resin may be, for example, easily purchased from a manufacturer such as Kukdo Chemical Co., Ltd.

A moisture-reactive absorbent serves to absorb moisture or humidity by chemical reaction with humidity, moisture or oxygen introduced into an adhesive. A physical absorbent may suppress moisture or humidity from penetrating into an encapsulation structure by increasing a travel path of the moisture or humidity and maximize a barrier property to moisture and humidity by an absorbance process.

The sealant/adhesive according to the present invention can include a moisture absorbent in addition to the curable resin. The term "moisture absorbent" refers to a general component that can absorb or remove moisture or humidity, which is flowing in from the outside, by physical or chemical reaction. That is, the moisture absorbent means a moisture-reactive absorbent or physical absorbent, and a mixture thereof may also be used herein. The terms "absorbent" and "getter" can be used interchangeably.

Specific kinds of the moisture absorbent that may be used herein are not particularly limited. For example, the moisture-reactive absorbent may include a metal powder, a metal oxide (e.g., alumina), a metal salt, phosphorus pentoxide ($P_2O_5$), or a mixture thereof, and the physical absorbent may include silica, zeolite, titania, zirconia or montmorillonite. Specific examples of the metal oxide described above may include lithium oxide ($Li_2O$), sodium oxide ($Na_2O$), barium oxide (BaO), calcium oxide (CaO) or magnesium oxide (MgO), and examples of the metal salt may include, but are not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cerium bromide ($CeBr_3$), selenium bromide ($SeBr_4$), vanadium bromide ($VBr_3$), magnesium bromide (MgBr$_2$), barium iodide (BaI$_2$) or magnesium iodide (MgI$_2$); or a metal chlorate such as barium perchlorate (Ba(ClO$_4$)$_2$) or magnesium perchlorate (Mg(ClO$_4$)$_2$).

According to the present invention, the moisture absorbent such as a metal oxide may be properly processed and blended with a composition. For example, the sealant or adhesive may be a thin film having a thickness of 30 μm or less according to the kind of the OLED to which an adhesive is applied. In this case, a process of grinding a moisture absorbent is required. The grinding of the moisture absorbent may be performed using a process such as 3-roll milling, bead milling or ball milling.

The sealant or adhesive according to the present invention may include a filler, preferably an inorganic filler. The filler may suppress moisture or humidity from penetrating into an encapsulation structure by increasing a travel path of the moisture or humidity, and maximize a barrier property to moisture and humidity by interaction with a matrix structure of the curable resin and a moisture-reactive absorbent. Specific kinds of the filler that may be used herein are not particularly limited. For example, clay, talc, acicular silica, or a mixture of at least one thereof may be used. According to the present invention, in order to improve the efficiency of binding between a filler and an organic binder, a product surface-treated with an organic material may be used as the filler, or may also be used together with a coupling agent.

The sealant or adhesive according to the present invention may include the filler at a content of 1 part by weight to 50 parts by weight, preferably 1 part by weight to 20 parts by weight, based on 100 parts by weight of the curable resin. When the content of the filler is controlled to 1 part by weight or more, a cured product having an excellent barrier property to moisture or humidity and excellent mechanical properties may be provided. Also, when the content of the filler is controlled to 50 parts by weight or less according to the present invention, the curable resin may be prepared in the form of a film, and a cured product showing an excellent barrier property to moisture or humidity even when the curable resin is formed into a thin film may also be provided.

The sealant or adhesive according to the present invention may further include a curing agent which can react with a curable resin to form a matrix such as a cross-linking structure. Specific kinds of the curing agent that may be used herein are not particularly limited, but may be properly selected according to the curable resins used, or the kinds of functional groups included in the curable resins. According to the present invention, for example, when an epoxy resin is used as the curable resin, a typical curing agent for epoxy resins known in the art may be used as the curing agent. More particularly, the curing agent may include, but is not limited to, various compounds such as an amine-based compound, an imidazole-based compound, a phenol-based compound, a phosphorus-based compound or an acid anhydride-based compound, which may be used alone or in combination.

The sealant or adhesive according to the present invention may, for example, include the curing agent at a content of 1 part by weight to 20 parts by weight, preferably 1 part by weight to 10 parts by weight, based on 100 parts by weight of the thermosetting resin. However, the content of the thermosetting resin is merely one exemplary embodiment of the present invention. That is, the content of the curing agent may be varied in the present invention according to the kind and content of the curable resins or their functional groups, the matrix structure to be realized, or the cross-linking density.

The sealant/adhesive according to the present invention may further include a high molecular weight resin. The high molecular weight resin may serve to improve formability when a composition according to the present invention is shaped in the form of a film or sheet. Also, the high molecular weight resin may serve as a high-temperature viscosity controlling agent for controlling the flowability during a hot-melting process.

Kinds of the high molecular weight resin that may be used herein are not particularly limited as long as they have compatibility with other components such as a curable resin. Specific examples of the high molecular weight resin that may be used herein may include, but are not limited to, resins having a weight average molecular weight of 20,000 or more, for example, a phenoxy resin, an acrylate resin, a high molecular weight epoxy resin, a super-high molecular weight epoxy resin, a high-polarity functional group-containing rubber and a high-polarity functional group-containing reactive rubber, which may be used alone or in combination.

When the high molecular weight resin is included in the sealant/adhesive according to the present invention, the content of the high molecular weight resin is controlled according to the desired physical properties, but the present invention is not particularly limited thereto. For example, according to the present invention, the high molecular weight resin may be included at a content of approximately 200 parts by weight or less, preferably 150 parts by weight or less, and more preferably approximately 100 parts by weight or less, based on 100 parts by weight of the curable resin. According to the present invention, when the content of the high molecular weight resin is controlled to 200 parts by weight or less, the high molecular weight may effectively maintain the compatibility with each component of a resin composition, and also function as an adhesive.

It should be noted that, as shown in FIGS. 15A-15D and 16A-C, the sealant can be in direct contact with the cut edge (side wall) of the pass-through hole. While this is most desirable, it is not necessary in all embodiments. For example, in some embodiments the sealant may be applied to the support element and yet, may not be in direct contact with the cut edge. In these cases, there can be a gap between the sealant and the cut edge. The gap can desirably be filled with a dry gas such as argon or nitrogen. In the context of this this invention, "located along the side walls of the pass-through hole" means that the sealant, which is in contact with the support element, lies between the cut edge of the pass-through hole and the outside environment and roughly parallel to the cut edge and may be in direct contact with or spaced from the cut edge.

In embodiments (for example, those shown in FIGS. 16A-16C) where the support elements are arranged so that that contact is made with both the top and bottom faces of the OLED panel to form a contained space or gap along the side wall of the pass-through hole, the sealant can be a dry gas such as argon or nitrogen. In such embodiments, it may be necessary to leave a temporary hole or gap in order to fill the space with the gas and/or allow for excess pressure to escape during formation of the space. The temporary hole or gap is then closed. The contained space may also contain getter particles if desired. One benefit of keeping a gap would be if the support elements were both coated with the sealant, then pressing them together while leaving a contained space along the side wall would not require a sharp bend in either the support element nor barrier film that could damage the barrier properties of either the support element.

In order to provide sufficient protection against water and oxygen penetration into the cut edges of the pass-through hole, it is desirable that the sealant forms a layer that is at least 3 mm thick. That is, the sealant forms a layer over the side wall that is at least 3 mm thick and extends at least from the top face of the OLED panel to the bottom face. In many embodiments, the part of the support element that is within the pass-through hole and parallel to the side wall will be spaced at least 3 mm from the side wall to allow the desired sealant thickness. There still may be an additional gap between the 3 mm or greater sealant layer and the side wall. In the context of this invention, the "thickness" of the sealant is measured in a direction perpendicular to the side wall.

Suitable barrier films are generally made of metal, metallized or polymer laminated films or barrier coated polymer films. The metal films are opaque but can be easily formed in a desired shape. Laminated and barrier coated films can be transparent or opaque and can be easily cut to the desired shape. Such materials are well known and widely commercially available from numerous manufacturers. Some typical examples are described in U.S. Pat. Nos. 10,076,891; 9,799,854, 9,831,466 and US2015/0364720. They may be adhered to the OLED panel with a suitable sealant or adhesive. Barrier films are typically impervious to moisture and will generally have a WVTR of $10^{-6}$ g/m²/day or less. They will often contain getter particles. If the barrier film is transparent, it is desirable that it has a minimum transmission of light of at least 80% and more desirably, at least 90%.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST 2 center emissive area
3 pass-through hole
3' new pass-through hole in FIG. 16C
4 non-emitting border
5 OLED panel substrate
6 OLED light-emitting unit
8 solid element
9 gap
10 flange or flair for support
11 hollow inside
12 ring-shaped collar
15 camera lens
16 camera body
20 lens
22 1$^{st}$ electrode
24 organic layer(s)
26 2$^{nd}$ electrode
28 encapsulation
30 OLED panel
35 OLED panel
40 OLED panel
45 OLED panel
50 braces for OLED panels
52 first electrical connection
54 second electrical connection
55 top housing
56 bottom housing
57 opening in top housing 55
59 opening in bottom housing 56
62 luminaire support arm
63 bendable joint (shown as dotted lines)
64 luminaire base
70 OLED module
72 luminaire support arm
74 luminaire base
90 bushing
92 lip
94 gap between lip and cut edge
96 sealant
98 barrier film or metal, placed over top edge of lip 92
100 OLED panel
101 first barrier film
102 sealant
104 second barrier film, metal
200 OLED panel
300 OLED panel
400 OLED panel
500 OLED panel
600 OLED panel
700 OLED panel
800 OLED panel
900 OLED panel
1000 OLED panel

The invention claimed is:

1. A method of making a fully encapsulated OLED panel with a pass-through hole comprising:
   creating a pass-through hole having side walls such that the pass-through hole is located entirely within the central emission area of an OLED panel;
   providing at least a first support element arranged in contact with at least a portion of the top or bottom face of the OLED panel and overlapping the edge of the pass-through hole such that at least a portion of the support element is located above or within the pass-through hole and spaced from the side walls of the pass-through hole; and
   providing a sealant in contact with the first support element and located along the side walls of the pass-through hole.

2. The method of claim 1 where the sealant is in direct contact with the side wall of the pass-through hole.

3. The method of claim 1 where the first support element has a water vapor transmission rate (WVTR) of $10^{-6}$ g/m²/day or less.

4. The method of claim 1 where the support element is in contact with at least a portion of both top and bottom faces of the OLED panel.

5. The method of claim 1 where there is a barrier film in contact with the support element and the other face of the OLED panel such that it covers the sealant.

6. The method of claim 1 where the sealant comprises a resin with moisture-absorbing getter particles.

7. The method of claim 1 where the sealant located along the side walls of the pass-through hole is at least 3 mm thick.

8. The method of claim 1 where the support element comprises a bushing with a lip; said bushing having the same shape as the pass-through hole and sized as to fit the lip within the pass-through hole.

9. The method of claim 1 comprising the additional steps of:
providing a second support element being in contact with at least a portion of the face of the OLED panel opposite the first support element such that the sealant is in contact with both the first and second support elements.

10. The method of claim 9 where the sealant is also in direct contact with the side walls of the pass-through hole.

11. The method of claim 9 where both the first and second support elements are transparent moisture barrier films.

12. The method of claim 9 where both the first and second support elements span the entire area of the pass-through hole.

13. The method of claim 12 comprising the additional step of:
providing a second pass-through hole through the first and second support elements; said second pass-through hole being smaller in area than the pass-through hole in the OLED panel such that at least a portion of the sealant remains located along the side walls of the pass-through hole in the OLED panel.

14. The method of claim 9 where the sealant entirely fills the pass-through hole of the OLED panel between the side walls.

15. The method of claim 14 comprising the additional step of:
providing a second pass-through hole through the first support element, the sealant and the second support element; said second pass-through hole being smaller in area than the pass-through hole in the OLED panel such that at least a portion of the sealant remains located along the side walls of the pass-through hole in the OLED panel.

16. The method of claim 1 where the OLED panel is a lighting panel.

17. The method of claim 16 where if the OLED panel has an emission surface of 10,000 mm$^2$ or less, the pass-through hole has a minimum opening area of at least 1.7 mm$^2$.

18. The method of claim 16 where if the OLED panel has an emission area of greater than 10,000 mm$^2$, the pass-through hole has a minimum opening area of at least 0.017% of the total emission surface.

* * * * *